(12) United States Patent
Shin et al.

(10) Patent No.: US 8,243,543 B2
(45) Date of Patent: Aug. 14, 2012

(54) SEMICONDUCTOR MEMORY DEVICE FOR HIGH-SPEED DATA INPUT/OUTPUT

(75) Inventors: Beom-Ju Shin, Kyoungki-do (KR); Sang-Sic Yoon, Kyoungki-do (KR)

(73) Assignee: Hynix Semiconductor Inc. (KR)

( * ) Notice: Subject to any disclaimer, the term of this patent is extended or adjusted under 35 U.S.C. 154(b) by 989 days.

(21) Appl. No.: 12/217,019

(22) Filed: Jun. 30, 2008

(65) Prior Publication Data

US 2009/0219764 A1    Sep. 3, 2009

(30) Foreign Application Priority Data

Feb. 29, 2008 (KR) .................... 10-2008-0019064
Feb. 29, 2008 (KR) .................... 10-2008-0019065

(51) Int. Cl.
*G11C 7/00* (2006.01)
(52) U.S. Cl. ................ 365/219; 365/198; 365/201
(58) Field of Classification Search .............. 365/201, 365/219
See application file for complete search history.

(56) References Cited

U.S. PATENT DOCUMENTS

| 5,243,599 | A  | * | 9/1993 | Barrett et al. ............. 370/541 |
| 6,741,193 | B2 | * | 5/2004 | Nagata ..................... 341/101 |
| 7,006,021 | B1 | * | 2/2006 | Lombaard ................. 341/100 |
| 7,358,872 | B2 | * | 4/2008 | Morzano et al. .......... 341/100 |
| 2005/0024243 | A1 |  | 2/2005 | Kim |
| 2009/0222713 | A1 | * | 9/2009 | Shin et al. ................ 714/807 |

FOREIGN PATENT DOCUMENTS

| KR | 2003-0029113 A | 4/2003 |
| KR | 10-2003-0064391 A | 7/2003 |
| KR | 10-2004-0058771 A | 7/2004 |
| KR | 10-2006-0122517 A | 11/2006 |
| WO | WO 2007/028095 A2 | 3/2007 |

* cited by examiner

*Primary Examiner* — Alexander Sofocleous
(74) *Attorney, Agent, or Firm* — Blakely, Sokoloff, Taylor & Zafman

(57) ABSTRACT

Semiconductor memory device for high-speed data input/output includes a first serializer configured to partially serialize input 8-bit parallel data to output first to fourth serial data, a second serializer configured to partially serialize the first to fourth serial data to output fifth and sixth serial data and a third serializer configured to serialize the fifth and sixth serial data to output seventh serial data.

33 Claims, 16 Drawing Sheets

SEMICONDUCTOR MEMORY DEVICE FOR HIGH-SPEED DATA INPUT/OUTPUT

CROSS-REFERENCE TO RELATED APPLICATIONS

The present invention claims priority of Korean patent application number 10-2008-0019064 and 10-2008-0019065 filed on Feb. 29, 2008, respectively which is incorporated by reference in their entirety.

BACKGROUND OF THE INVENTION

The present invention relates to a semiconductor memory device capable of operating at a high speed, and more particularly, to a data output control circuit for aligning and controlling a plurality of data output from a semiconductor memory device that operates at a high speed.

In a system with a variety of semiconductor devices, a semiconductor memory device serves as a data storage unit. The semiconductor memory device outputs data corresponding to addresses received from a data processor, e.g., a central processing unit (CPU), or stores data received from the data processor into memory cells selected by addresses.

As the operating speed of the system increases and semiconductor integrated circuit technologies are advanced, semiconductor memory devices are required to input and output data at a higher speed. In order to provide a faster and more stable operation of semiconductor memory devices, a variety of circuits inside the semiconductor memory devices must be able to operate at a high speed and transfer signals or data between the circuits at a high speed.

A fast operation of the semiconductor memory device can be achieved by executing a plurality of internal operations at a higher speed and increasing signal and data input/output speeds. As an example, a double data rate (DDR) synchronous dynamic random access memory (SDRAM) can achieve a high-speed data transfer by outputting data in synchronization with falling and rising edges of a system clock. Since the DDR SDRAM can input and output two data through one input/output terminal in one cycle of the system clock, its data input/output speed is higher than that of a typical semiconductor memory device. At present, a semiconductor memory device has been proposed which inputs and outputs four data in one cycle of a system clock.

The DDR SDRAM adopts a prefetch operation in order to output data at a high speed. Herein, the prefetch operation refers to an operation to previously store data or commands at a high speed before the data or commands are processed. For example, the DDR SDRAM accesses memory cells and outputs 2-bit data to a data pad in each clock cycle. Such a prefetch operation is referred to as a 2-bit prefetch operation. In addition, a DDR2 SDRAM adopts a 4-bit prefetch operation to access memory cells and output 4-bit data to a data pad in each clock cycle. A DDR3 SDRAM adopts an 8-bit prefetch operation to access memory cells and output 8-bit data to a data pad in each clock cycle. In this way, the data input/output speed must have been increased in order to enable the semiconductor memory device to operate at a high speed in synchronization with a high-frequency clock. Hence, the semiconductor memory device adopts an operation scheme that reads or writes data corresponding to a minimum burst length through each data input/output pad (DQ) in response to one-time read or write command. This scheme is referred to as an N-bit prefetch operation, where N is equal to the minimum burst length.

As described above, since a semiconductor memory device recently proposed is required to input and output four data in one cycle of a system clock, it adopts an 8-bit prefetch operation for high-speed data input/output. Eight data output from unit cells in response to one read command are transferred in parallel through the corresponding sense amplifiers and data input/output lines. The parallel data are serialized in order to output them through one data pad. In order to control such an operation, the semiconductor memory device includes a plurality of data output circuits connected respectively to a plurality of data input/output pads.

FIG. 1 is a block diagram of a data output circuit of a conventional semiconductor memory device.

Referring to FIG. 1, the data output circuit includes a first multiplexer 120, a second multiplexer 140, a latch unit 160, and a third multiplexer 180. The first multiplexer 120 is configured to sequentially output four data D0, D2, D4 and D6, which are output and received in parallel from unit cells, in response to a selection signal SOSEB<2:1>. Hereinafter, the four data D0, D2, D4 and D6 are also referred to as 4-bit data in terms of the number of bits. The second multiplexer 140 is configured to sequentially output the other 4-bit data D1, D3, D5 and D7, which are output and received in parallel from the unit cells, in response to the selection signal SOSEB<2:1>. The latch unit 160 is configured to transfer 4-bit serial data N2, which are received from the second multiplexer 140, in response to a delay locked clock RCLK_DLL. The third multiplexer 180 is configured to sequentially transfer data N1 and N3, which are received respectively from the first multiplexer 120 and the latch unit 160, in response to the delay locked clock RCLK_DLL.

Specifically, data, which are to be transferred in synchronization with rising and falling edges of the delay locked clock RCLK_DLL, are separately transferred to the first multiplexer 120 and the second multiplexer 140. Herein, 4-bit data D0, D2, D4 and D6 transferred to the first multiplexer 120 are output in synchronization with the rising edge of the delay locked clock RCLK_DLL; and 4-bit data D1, D3, D5 and D7 transferred to the second multiplexer 140 are output in synchronization with the falling edge of the delay locked clock RCLK_DLL.

The 4-bit data transferred in parallel to the first and second multiplexers 120 and 140 are serialized by being sequentially output one by one in response to the selection signal SOSEB<2:1>. That is, the 4-bit data input into the first multiplexer 120 are output in the order of D0, D2, D4 and D6; and the 4-bit data input into the second multiplexer 140 are output in the order of D1, D3, D5 and D7. Herein, the selection signal SOSEB<2:1> is generated according to a burst type and a CAS latency CL stored in a mode register set MRS, on the basis of specific address information (e.g., A<2:1>) input together with a read command. That is, the activation time of the selection signal SOSEB<2:1> is determined according to the CAS latency CL, and the value of the selection signal SOSEB<2:1> is determined depending on which of 0 to 7 is a start address and which of a sequential type and a interleave type is a burst type. The data alignment illustrated in FIG. 1 is based on the assumption that the specific address data A<2:1> and A<0> input in response to the read command are all zero.

The latch unit 160 receives the 4-bit serial data N2 from the second multiplexer 140, uses the delay locked clock RCLK_DLL to shift the received 4-bit serial data N2 by 0.5 tCK (i.e., the half cycle of a system clock), and transfers the resulting data to the third multiplexer 180. Finally, the third multiplexer 180 transfers the data N1 received from the first multiplexer 120 in synchronization with a rising edge of the delay locked clock RCLK_DLL, and transfers the data N3 received from the latch unit 160 in synchronization with a falling edge of the delay locked clock RCLK_DLL. As a result, the third multiplexer 180 outputs data MXOUT in the order of D0, D1, D2, D3, D4, D5, D6 and D7 in synchronization with the iterative rising and falling edges of the delay locked clock RCLK_DLL.

FIG. 2 is a waveform diagram illustrating the operation of the semiconductor memory device illustrated in FIG. 1.

Referring to FIG. 2, after the read command is input, the data D0 to D7 are transferred from the time point preceding the CAS latency CL by 0.5 tCK (i.e., the half cycle of an external clock). Thereafter, the transferred data D0 to D7 are serialized in response to the selection signal SOSEB<2:1> and the resulting serial data are output to the outside from the CAS latency CL. Thus, each of the first multiplexer 120 and the second multiplexer 140 in the data output circuit must serialize the 4-bit data, which are input using the selection signal SOSEB<2:1>, within a time period of 0.5 tCK.

As illustrated in FIG. 2, the time for alignment of the first output data D0 among the output data D0 to D7 is smaller in operation margin than the time for alignment of the subsequent output data. As described above, the data output circuit uses the selection signal SOSEB<2:1> to align the data, which are received 0.5 tCK before output to the outside, within a time period of 0.5 tCK. Such an operation is not highly problematic if the operation frequency is not high. As an example, if one clock (i.e., 1 tCK) of the system clock is 1 ns, each of the first multiplexer 120 and the second multiplexer 140 must serialize the 4-bit data within a time period of 0.5 ns. However, the semiconductor memory device is required to operate according to a system clock with a higher frequency, and it is difficult to serialize data within a time period shorter than 0.5 ns, when considering an operation margin of a 4:1 multiplexer MUX used as the first multiplexer 120 and the second multiplexer 140 illustrated in FIG. 1.

Also, if the data output circuit illustrated in FIG. 1 receives the data D0 to D7 earlier than 0.5 tCK before output to the outside (e.g., 1 tCK or 2 tCK before the CAS latency CL), it is impossible to align and output the data D0 to D7 in synchronization with the CAS latency CL. Thus, the semiconductor memory device using the data output circuit illustrated in FIG. 1 has no choice but to have the limit of an operation frequency, and such a structure is not applicable to a semiconductor memory device that operates at a high speed.

SUMMARY OF THE INVENTION

Embodiments of the present invention are directed to increasing the reliability of an operation of a semiconductor memory device, which operates at a high speed, by aligning output data stably. A long operation margin is secured for alignment of internal data, thereby dealing with a high-frequency system clock.

Embodiments of the present invention are also directed to increasing the reliability of an operation of a semiconductor memory device, which operates at a high speed, by aligning output data stably. A preamble data pattern is selectively output to internal data, thereby preventing a data distortion (delay or skew) that may occur during the data input/output operation.

A semiconductor memory device requiring a high-speed operation must be able to input/output more data within a short time in response to a system clock. To this end, a semiconductor memory device in accordance with an embodiment of the present invention outputs internal parallel data corresponding to a read operation 1.5 tCK earlier than a data output time point, and secures a sufficient operation margin for serialization for output through an input/output pad. Also, a data output circuit in the semiconductor memory device performs a step-by-step serialization operation by using a plurality of multiplexers, a plurality of latch units, and a plurality of phase shifters that make it possible to serialize data input in parallel within an operation margin of 1.5 tCK and to output data at a time point of a CAS latency CL after application of a read command. The data output circuit of the present invention converts 8-bit parallel input data into four parallel data of 2-bit serial data, converts the four parallel data into two parallel data of 4-bit serial data, and finally converts the two parallel data into 8-bit serial data. Therefore, a sufficient operation margin for data alignment can be secured, thus making it possible for the semiconductor memory device to output aligned data in response to a system clock with a higher frequency.

In accordance with an aspect of the present invention, there is provided a first serializer configured to partially serialize input 8-bit parallel data to output first to fourth serial data, a second serializer configured to partially serialize the first to fourth serial data to output fifth and sixth serial data and a third serializer configured to serialize the fifth and sixth serial data to output seventh serial data.

In accordance with other aspect of the present invention, there is provided a first serializer configured to partially serialize input 8-bit parallel data to output first to fourth serial data, a data window UI of each data in the first to fourth serial data being four times the data window UI of each data in the seventh serial data, a second serializer configured to partially serialize the first to fourth serial data to output fifth and sixth serial data, the data window UI of each data in the fifth and sixth serial data being two times the data window UI of each data in the seventh serial data and a third serializer configured to serialize the fifth and sixth serial data to output seventh serial data. The data window UI represents a length of an available data.

In accordance with other aspect of the present invention, there is provided a first serialization operation of partially serializing input 8-bit parallel data, which are received from internal unit cells in response to a read command, to output first to fourth serial data, a second serialization operation of partially serializing the first to fourth serial data to output fifth and sixth serial data and a third serialization operation of serializing the fifth and sixth serial data to output seventh serial data.

DESCRIPTION OF SPECIFIC EMBODIMENTS

Hereinafter, a semiconductor memory device for high-speed data input/output in accordance with the present invention will be described in detail with reference to the accompanying drawings.

Figure 1:
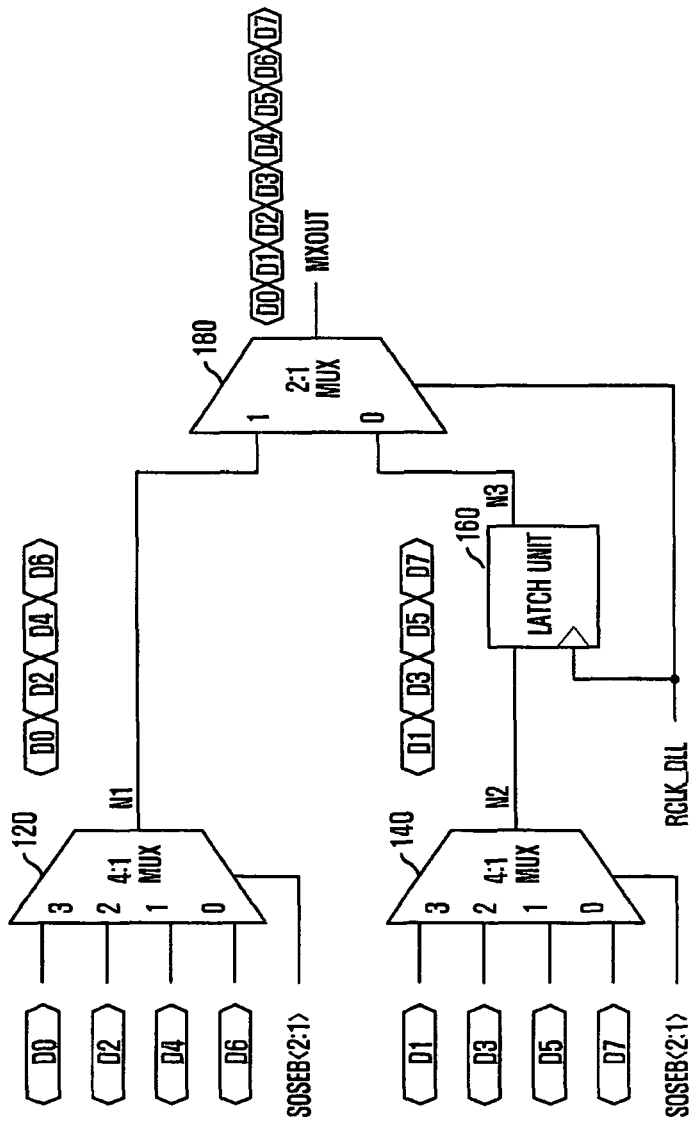
FIG. 1 is a block diagram of a data output circuit of a conventional semiconductor memory device.
Figure 2:
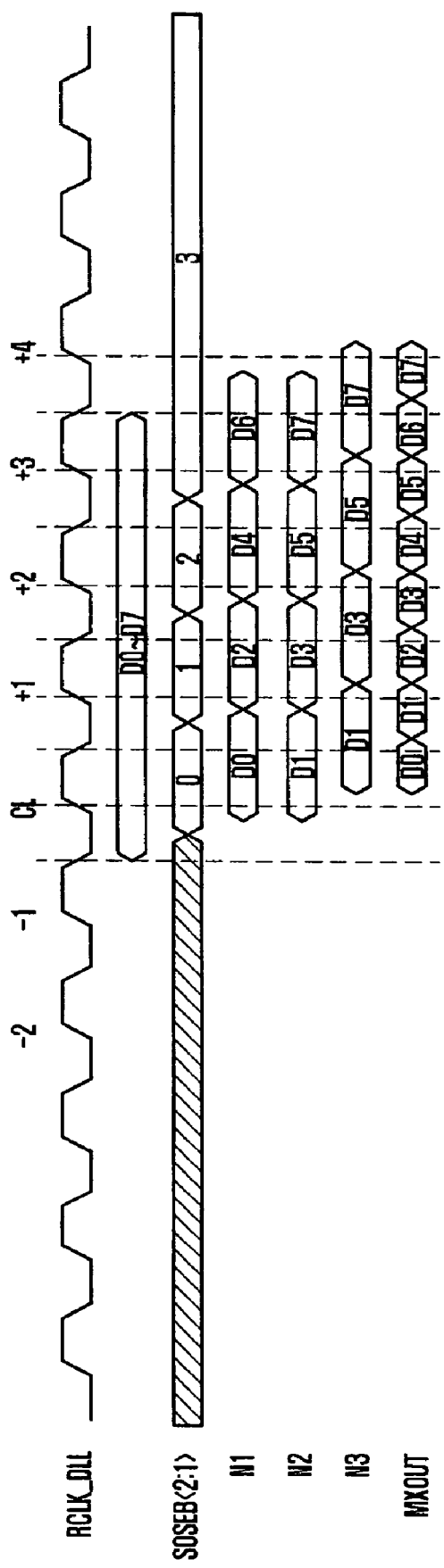
FIG. 2 is a waveform diagram illustrating the operation of the semiconductor memory device illustrated in FIG. 1.
Figure 3:
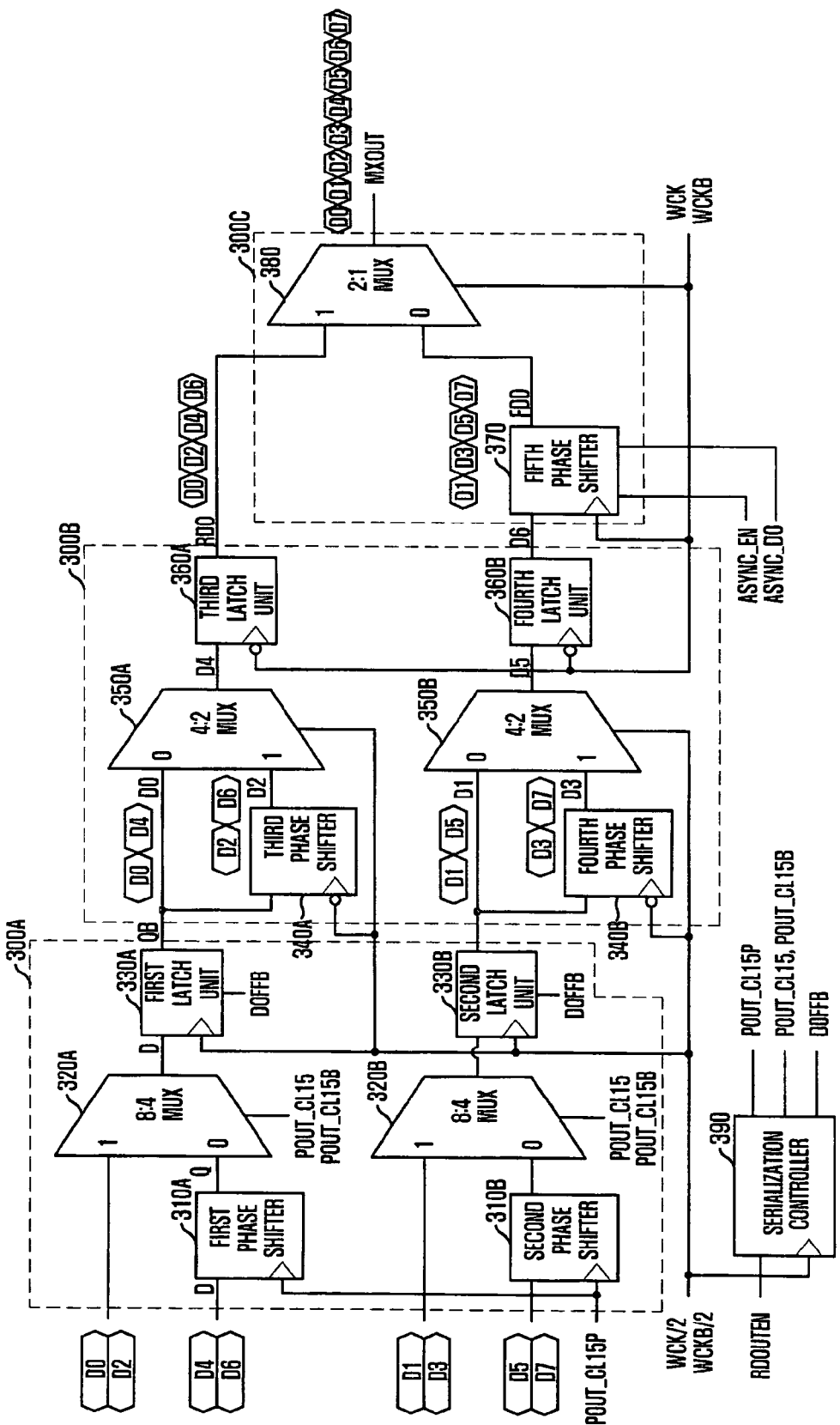
FIG. 3 is a block diagram of a data output circuit of a semiconductor memory device in accordance with an embodiment of the present invention.

FIG. 3 is a block diagram of a data output circuit of a semiconductor memory device in accordance with an embodiment of the present invention.

Referring to FIG. 3, the data output circuit includes a first serializer 300A, a second serializer 300B, and a third serializer 300C. The first serializer 300A is configured to serialize input 8-bit parallel data to output first to fourth 2-bit serial data. The second serializer 300B is configured to receive the output of the first serializer 300A to output fifth and sixth 4-bit serial data. The third serializer 300C is configured to receive the output of the second serializer 300B to output seventh 8-bit serial data.

Herein, the first serializer 300A includes first and second phase shifters 310A and 310B, first and second multiplexers 320A and 320B, and first and second latch units 330A and 330B. The first and second phase shifters 310A and 310B are configured to shift the phases of 4-bit data D4 to D7 among 8-bit data D0 to D7 four times (i.e., 4 UI) the data window UI of each data in the seventh serial data. The first and second multiplexers 320A and 320B are configured to multiplex the other 4-bit data D0 to D3 among the 8-bit data D0 to D7 and the outputs of the first and second phase shifters 310A and 310B to output first to fourth serial data. The first and second latch units 330A and 330B are configured to latch the outputs of the first and second multiplexers 320A and 320B.

Specifically, the first multiplexer 320A serializes odd-numbered data D0, D2, D4 and D6 among the 8-bit parallel data D0 to D7 into two pairs of 2-bit data. To this end, the first phase shifter 310A shifts the phases of 2-bit data D4 and D6 among the odd-numbered data D0, D2, D4 and D6 by delaying the 2-bit data D4 and D6 by the window 4 UI of the data aligned by the first and second multiplexers 320A and 320B. Likewise, the second phase shifter 310B and the second multiplexer 320B are used to serialize even-numbered data D1, D3, D5 and D7 among the 8-bit parallel data D0 to D7 into two pairs of 2-bit data. The 4-bit data of two pairs of 2-bit data output from the first and second multiplexers 320A and 320B are latched respectively by the first and second latch units 330A and 330B. Herein, the window of each data in the 4-bit serial data output from the first and second latch units 330A and 330B is four times (i.e., 4 UI) the window of each data in the seventh serial data output from the third serializer 300C.

The second serializer 300B receives the outputs of the first and second latch units 330A and 330B. The second serializer 300B includes third and fourth phase shifters 340A and 340B, third and fourth multiplexers 350A and 350B, and third and fourth latch units 360A and 360B. The third and fourth phase shifters 340A and 340B are configured to shift the phases of 2-bit data D2, D6 and D3, D7 among the 4-bit data two times (i.e., 2 UI) the data window UI of each data in the seventh serial data. The third and fourth multiplexers 350A and 350B are configured to multiplex the other 2-bit data D0, D4 and D1, D5 among the 4-bit data and the outputs of the third and fourth phase shifters 340A and 340B to output fifth and sixth serial data D0, D2, D4, D6 and D1, D3, D5, D7. The third and fourth latch units 360A and 360B are configured to latch the outputs of the third and fourth multiplexers 350A and 350B.

Specifically, the third and fourth phase shifters 340A and 340B delay the 2-bit data D2, D6 and D3, D7 among the 4-bit data, which are output from the first and second latch units 330A and 330B of the first serializer 300A, by using division clocks WCK/2 and WCKB/2 that are obtained by dividing data clocks WCK and WCKB at a division ratio of 1/2. Herein, the data clocks WCK and WCKB are used as a criterion for output of the seventh serial data. The frequency of the data clocks WCK and WCKB is two times higher than the frequency of a system clock, and the newly-proposed semiconductor memory device outputs two data for one cycle of the data clocks WCK and WCKB. That is, the data window UI of each data in the 8-bit serial data is half of the cycle of the data clocks WCK and WCKB.

The third phase shifter 340A and the fourth phase shifter 340B use the division clocks WCK/2 and WCKB/2, whose cycle is four times the data window UI of each data in the seventh serial data, to delay the phases of the 2-bit data D2, D6 and D3, D7 two times the data window UI of each data in the seventh serial data. Thereafter, the third and fourth multiplexers 350A and 350B output fifth and sixth serial data D0, D2, D4, D6 and D1, D3, D5, D7 by multiplexing the two data D2, D6 and D3, D7 delayed by the third and fourth phase shifters 340A 340B, and the non-delayed two data D0, D4 and D1, D5, among the 4-bit data output from the first and second latch units 330A and 330B. Finally, the third and fourth latch units 360A and 360B latch and transfer the outputs of the third and fourth multiplexers 350A and 350B to the third serializer 300C.

The third serializer 300C includes a fifth phase shifter 370 and a fifth multiplexer 380. The fifth phase shifter 370 is configured to shift the phase of the data D1, D3, D5, D7 among the fifth and sixth serial data D0, D2, D4, D6 and D1, D3, D5, D7 by the data window UI of each data in the seventh serial data. The fifth multiplexer 380 is configured to multiplex the other data D0, D2, D4, D6 among the fifth and sixth serial data D0, D2, D4, D6 and D1, D3, D5, D7 and the output of the fifth phase shifter 370 to output the seventh serial data D0, D1, D2, D3, D4, D5, D6, D7.

The data output circuit further includes a serialization controller 390. The serialization controller 390 is configured to output a first control pulse POUT_CL15P, a second control pulse POUT_CL15, and a data transfer signal DOFFB in response to a read data output signal RDOUTEN and the division clock WCK/2 of the data clock WCK. The read data output signal RDOUTEN is used to enable data output in response to a read command, and the division clock WCK/2 of the data clock WCK is used as a criterion for the data output. The first control pulse POUT_CL15P is used to control the first and second phase shifters 310A and 310B of the first serializer 300A; the second control pulse POUT_CL15 is used to control the first and second multiplexers 320A and 320B; and the data transfer signal DOFFB is used to control the first and second latch units 330A and 330B.

Figure 4:
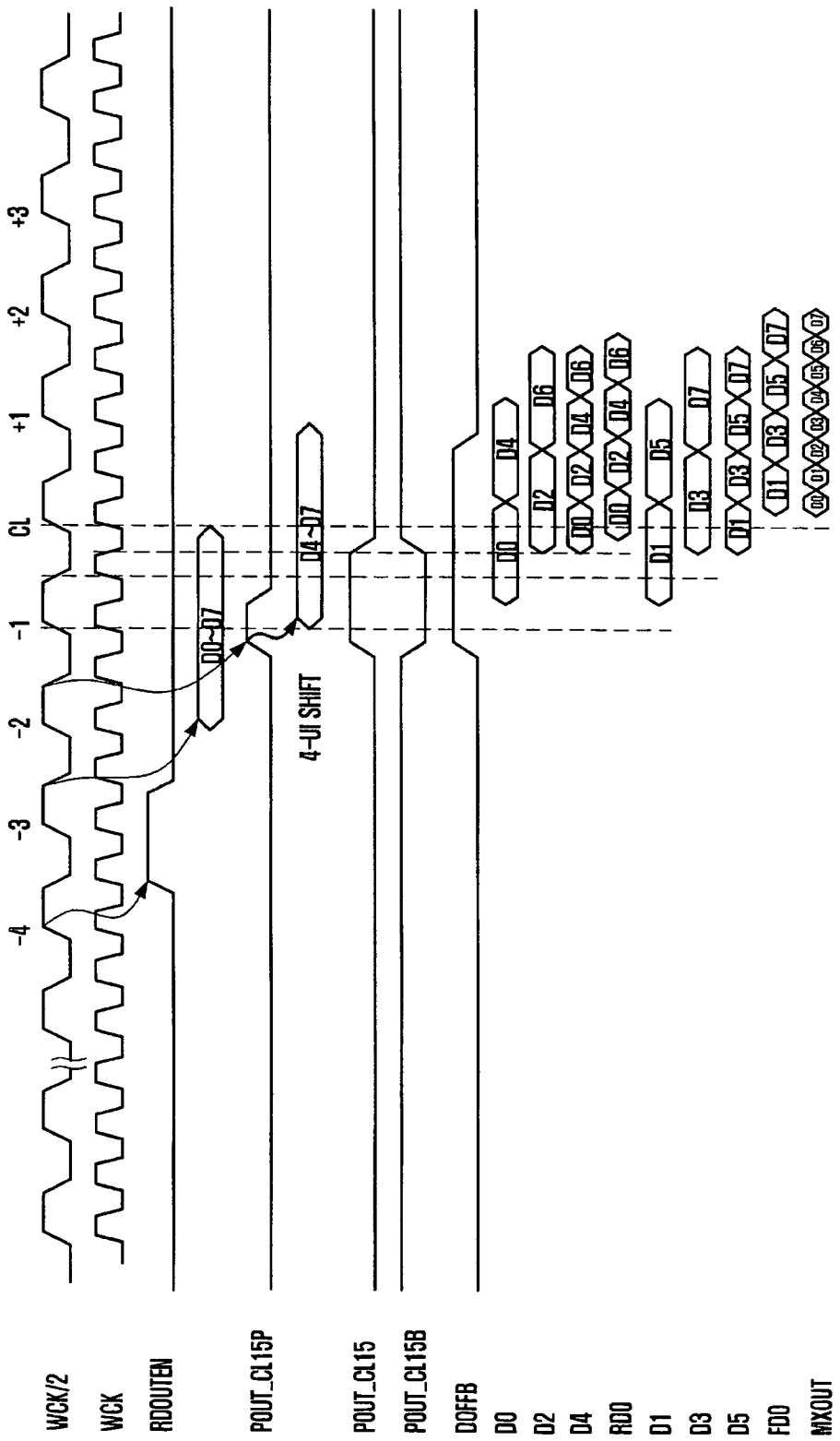
FIG. 4 is a waveform diagram illustrating the operation of the semiconductor memory device illustrated in FIG. 3.

FIG. 4 is a waveform diagram illustrating the operation of the semiconductor memory device illustrated in FIG. 3. Specifically, the operation of the semiconductor memory device is described in terms of the data clock WCK and the division clock WCK/2, and FIG. 4 illustrates an exemplary case of a semiconductor memory device of the present invention where the frequency of a division clock WCK/2 is equal to the frequency of a system clock and four data are output for one clock tCK of the system clock.

Referring to FIG. 4, the semiconductor memory device outputs the seventh serial data D0, D1, D2, D3, D4, D5, D6, D7 from the time point of the CAS latency CL after application of the read command. Specifically, the semiconductor memory device activates the read data output signal RDOUTEN corresponding to the read command at the time point 4 tCK (i.e., four cycles of the system clock) earlier than the CAS latency CL. Thereafter, the serialization controller 390 of the data output circuit generates a plurality of signals for control of the first serializer 300A in response to the read data output signal RDOUTEN. In addition, the multi-bit data D0 to D7 output from the internal unit cells are transferred to the data output circuit at the time point 2.5 tCK earlier than the CAS latency CL.

The multi-bit data D0 to D7 are transferred in parallel to the data output circuit. The data output circuit serializes the input multi-bit parallel data D0 to D7 to output the seventh serial data D0, D1, D2, D3, D4, D5, D6, D7. First, the serialization controller 390 activates the first control pulse POUT_CL15P at the time point 1.5 tCK earlier than the CAS latency CL in response to the read data output signal RDOUTEN. The first and second phase shifters 310A and 310B of the first serializer 300A delay the 4-bit data D4 to D7 among the multi-bit data D0 to D7 by 1 tCK (i.e., 4 UI) in response to the activated first control pulse POUT_CL15P.

Also, the serialization controller 390 activates the second control pulse POUT_CL15 to a logic high level at the time point 1.5 tCK earlier than the CAS latency CL, like the first control pulse POUT_CL15P. At this point, an inversion signal POUT_CL15B of the second control pulse POUT_CL15 becomes a logic low level. In response to the second control pulse POUT_CL15 and the inversion signal of the POUT_CL15B of the second control pulse POUT_CL15, the first and second multiplexers 320A and 320B serialize the input parallel 4-bit data D0 to D3 and the other 4-bit data D4 to D7 whose phases are shifted by the first and second phase shifters 310A and 310B. After the first to fourth serial data D0, D4, D2, D6, D1, D5 and D3, D7 are generated by the first and second multiplexers 320a and 320B, the first and second latch units 330A and 330B transfer the first to fourth serial data D0, D4, D2, D6, D1, D5 and D3, D7 to the second serializer 300B in response to the data transfer signal DOFFB output from the serialization controller 390.

The first to fourth serial data D2, D6 and D3, D7 transferred to the second serializer 300B are delayed by the third and fourth phase shifters 340A and 340B by 0.5 tCK (i.e., 2 UI). Thereafter, the third and fourth multiplexers 350A and 350B receive the 2-bit data delayed by the third and fourth phase shifters 340A and 340B and the non-delayed 2-bit data output from the first and second latch units 330A and 330B, and serialize the received 2-bit data into the fifth and sixth serial data. The fifth and sixth serial data are transferred respectively through the third and fourth latch units 360A and 360B to the third serializer 300C. In particular, the third and fourth latch units 360A and 350B transfer the corresponding data 0.25 tCK earlier than the CAS latency CL in response to a falling edge of the data clock WCK. Referring to FIG. 4, the operation of the second serializer 300B can be seen from the 4-bit data D0, D4, D2, D6, D1, D5 and D3, D7 transferred to the input terminals d0, d1, d2 and d3 of the third and fourth multiplexers 350A and 350B and the fifth and sixth serial data multiplexers D0, D2, D4, D6 and D1, D3, D5, D7 output through the output terminals d4 and d5 of the third and fourth multiplexers 350A and 350B.

The phase of the data D1, D3, D5, D7 transferred through the fourth latch unit 360B to the third serializer 300C is delayed by UI corresponding to the fifth phase shifter 370. When transferred through the third latch unit 360A to the fifth multiplexer 380 in synchronization with a falling edge of the data clock WCK 0.25 tCK (i.e., the half cycle of the data clock WCK) earlier than the CAS latency CL, the data D0, D2, D4, D6 (i.e., RDO) start to be output by the fifth multiplexer 380 in synchronization with a rising edge of the data clock WCK. On the other hand, the other data D1, D3, D5, D7 (i.e., FDO) delayed by the fifth phase shifter 370 are transferred to the fifth multiplexer 380 in synchronization with a rising edge of the data clock WCK and then start to be output by the fifth multiplexer 380 in synchronization with a falling edge of the data clock WCK. Through the above-described operations, the 8-bit parallel data D0 to D7, which are received in parallel from the time point of the CAS latency CL after application of the read command, are serialized by the data output circuit into the seventh serial data D0, D1, D2, D3, D4, D5, D6, D7 that are output sequentially.

Figure 5:
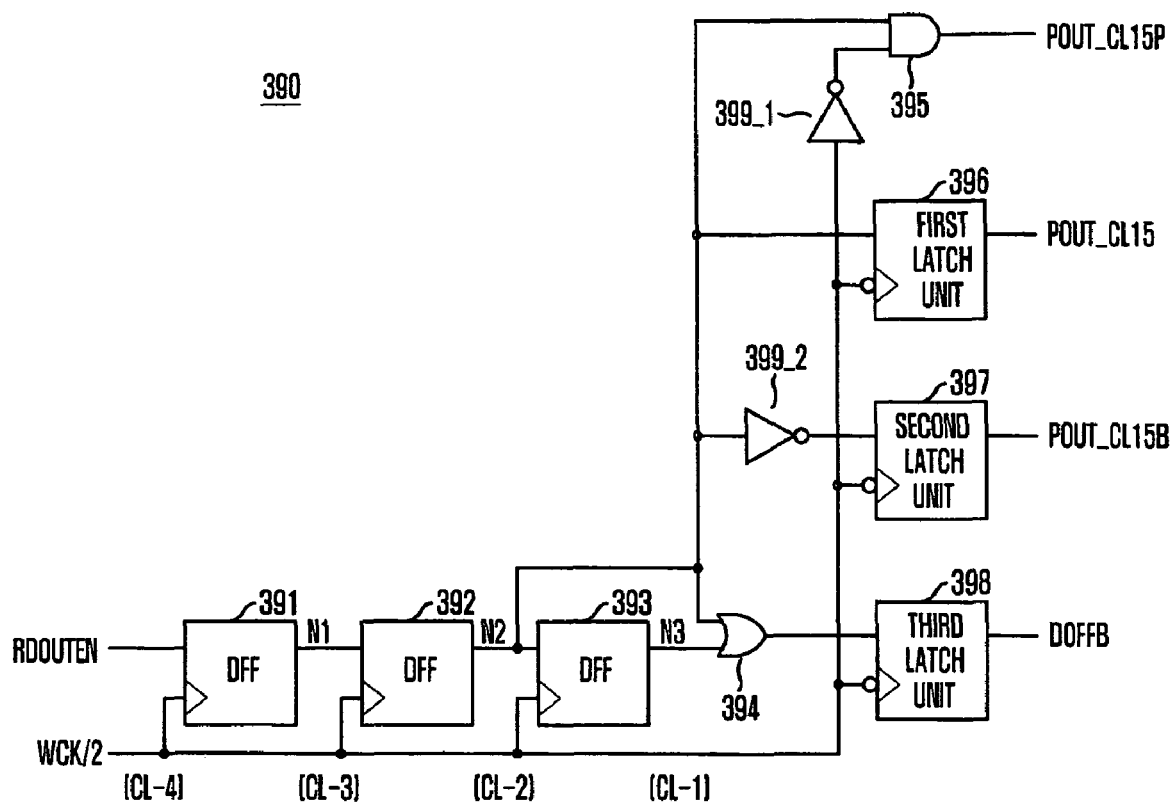
FIG. 5 is a block diagram of a serialization controller illustrated in FIG. 3.

FIG. 5 is a block diagram of the serialization controller 390 illustrated in FIG. 3.

Referring to FIG. 5, the serialization controller 390 includes a plurality of flip-flops 391, 392 and 393 and first to third latches 396, 397 and 398 that are configured to the output the first control pulse POUT_CL15P, the second control pulses POUT_CL15 and POUT_CL15B, and the data transfer signal DOFFB in response to the read data output signal RDOUTEN and the division clock WCK/2. The first latch 396 outputs the first control pulse POUT_CL15P for controlling the first and second phase shifters 310A and 310B in response to the read data output signal RDOUTEN, and the second latch 397 outputs the second control pulses POUT_CL15 and POUT_CL15B having an activation period of two times (i.e., 1 tCK) longer the cycle of the data clock WCK for controlling the first and second multiplexers 320A and 320B. The data transfer signal DOFFB has an activation period of four times (i.e., 2 tCK) longer than the cycle of the data clock WCK, and is output through the third latch 398.

Specifically, when the read data output signal RDOUTEN is activated to a logic high level at a time point CL-4 earlier than the CAS latency CL by four cycles of the system clock, the flip-flops 391, 392 and 393 shift the phase of the read data output signal RDOUTEN in response to the division clock WCK/2. An output terminal N2 of the second flip-flop 392 is enabled to a logic high level at a time point CL-2 earlier than the CAS latency CL by two cycles of the system clock. At this point, an AND gate 395 activates the first control pulse POUT_CL15P at a time point of the division clock WCK/2 inverted by a first inverter 399_1, that is, at a falling edge of the division clock WCK/2. At this point, the first control pulse POUT_CL15P has an activation period as long as the cycle of the data clock WCK.

After the output terminal N2 of the second flip-flop 392 is enabled to a logic high level, the first latch 396 generates the second control pulse POUT_CL15 in response to a falling edge of the division clock WCK/2. On the other hand, the second latch 397, which has received the output of a second inverter 399_2 obtained by inversion of the output terminal N2 of the second flip-flop 392, generates an inversion signal POUT_CL15B of the second control pulse POUT_CL15 in response to a falling edge of the division clock WCK/2. Herein, the second control pulse POUT_CL15 and the inversion signal POUT_CL15B of the second control pulse POUT_CL15 may have an activation period as long as 1 tCK (i.e., one cycle of the system clock) due to the first and second latches 396 and 397 that operate in response to a falling edge of the division clock WCK/2.

Together with the activation of the second control pulse POUT_CL15, the data transfer signal DOFFB is also generated by the third latch 398 that operates in response to a falling edge of the division clock WCK/2. However, the third latch 398 can output the data transfer signal DOFFB having an activation period two times longer than the second control pulse POUT_CL15, by receiving the outputs of the second and third flip-flops 392 and 393 through an OR gate 394.

Figure 6:
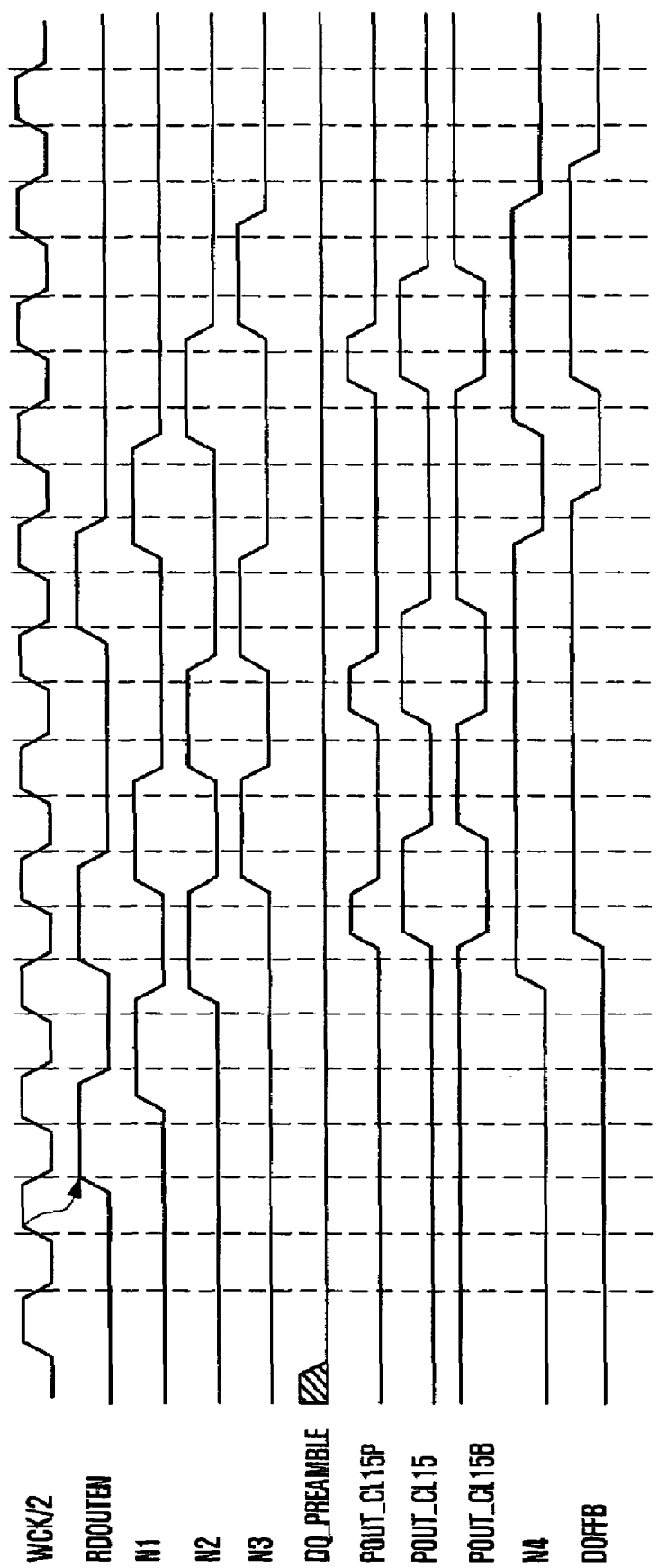
FIG. 6 is a waveform diagram illustrating the operation of the serialization controller illustrated in FIG. 5.

FIG. 6 is a waveform diagram illustrating the operation of the serialization controller 390 illustrated in FIG. 5.

Referring to FIG. 6, the serialization controller 390 generates a plurality of signals on the basis of the division clock WCK/2 in response to the read data output signal RDOUTEN. First, when the read data output signal RDOUTEN is activated, the flip-flops 391, 392 and 393 delay the phase by the cycle of the division clock WCK/2 (see the output terminals N1, N2 and N3 of the flip-flops 391, 392 and 393). Thereafter, the first and second latches 396 and 397 of the serialization controller 390 generate the first and second control pulses POUT_CL15P, POUT_CL15 and POUT_CL15B in response to a falling edge of the division clock WCK/2. Also, the OR gate 394 OR-operates the outputs of the second and third flip-flops 392 and 393 to transfer an output pulse with a two-time activation period to the third latch 398 through an output terminal N4, and the third latch 398 outputs the data transfer signal DOFFB in response to a falling edge of the division clock WCK/2.

Figure 7:
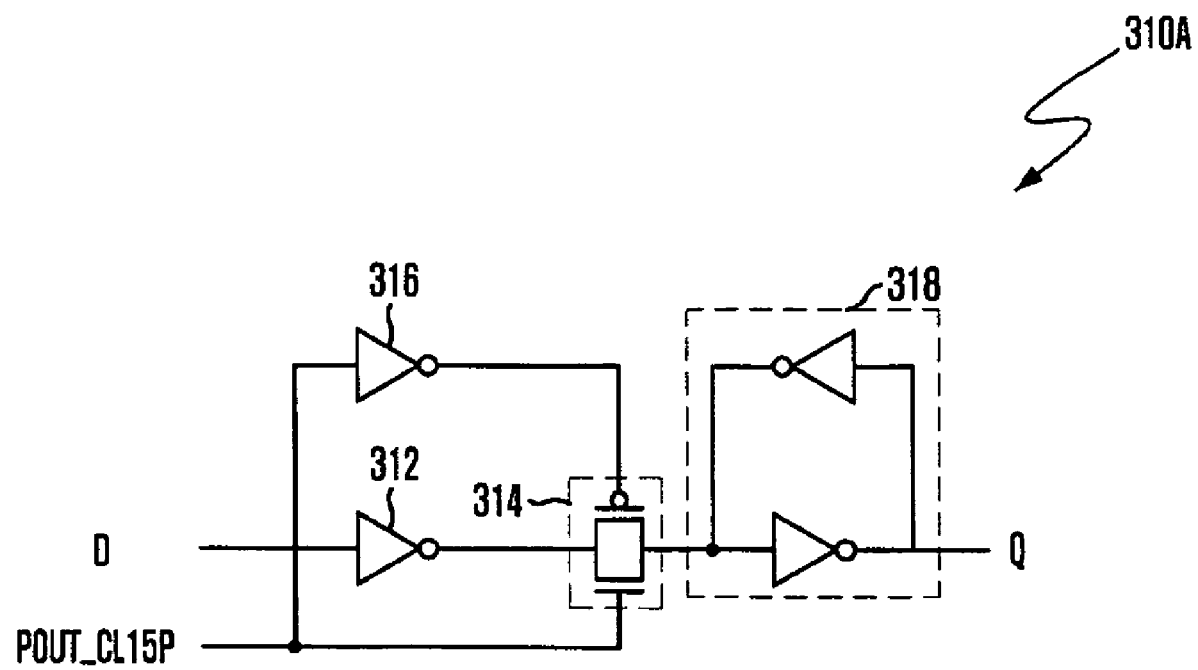
FIG. 7 is a circuit diagram of a first phase shifter illustrated in FIG. 3.

FIG. 7 is a circuit diagram of the first phase shifter 310A illustrated in FIG. 3.

Referring to FIG. 7, the first phase shifter 310A includes a plurality of unit latches that are configured to shift the phases of a plurality of parallel input data D4 and D6. Herein, the unit latch includes a third inverter 312, a transfer gate 314, and an inverter latch 318. The third inverter 312 is configured to invert input data D. The transfer gate 314 is configured to transfer the output of the third inverter 312 in response to the first control pulse POUT_CL15P. The inverter latch 318 is configured to latch and invert the output of the transfer gate 314. The unit latch further includes a fourth inverter 316 that is configured to invert the first control pulse POUT_CL15P in order to control the transfer gate 314. Although not illustrated, the second phase shifter 310B has the same components as the first phase shifter 310A.

Figure 8:
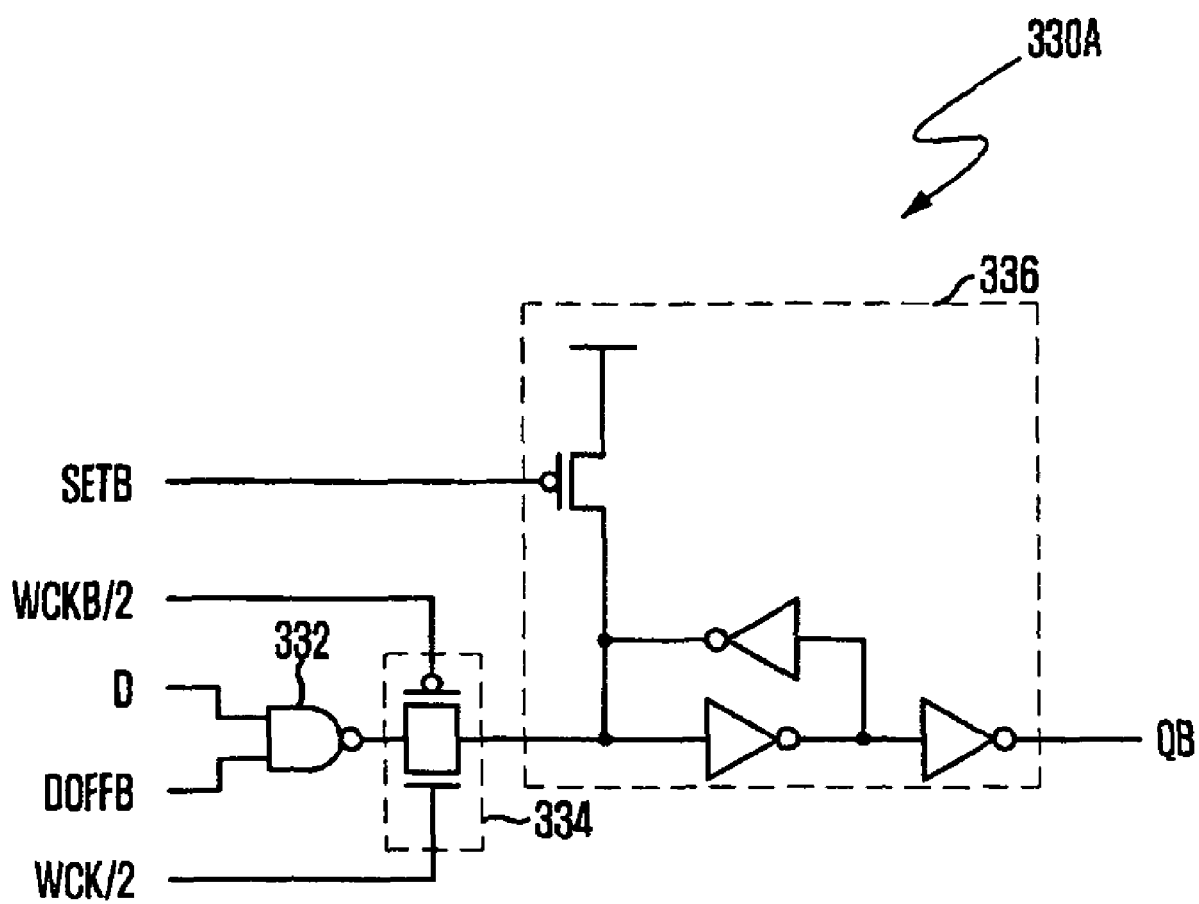
FIG. 8 is a circuit diagram of a first latch unit illustrated in FIG. 3.

FIG. 8 is a circuit diagram of the first latch unit 330A illustrated in FIG. 3.

Referring to FIG. 8, the first latch unit 330A includes a plurality of unit latches that are configured to latch a plurality of serial data output from the first multiplexer 320A. Herein, the unit latch includes a NAND gate 332, a transfer gate 334, and an inverter latch 336. The NAND gate 332 is configured to invert data in response to the data transfer signal DOFFB. The transfer gate 334 is configured to transfer the output of the NAND gate 332 at intervals of four times the data window UI of each data in the seventh serial data. The inverter latch 336 is configured to latch and invert the output of the transfer gate 334.

Herein, when the data transfer signal DOFFB is at a logic high level, the NAND gate 332 inverts input data D and transfers the inverted data to the transfer gate 334. On the other hand, when the data transfer signal DOFFB is at a logic low level, the NAND gate 332 transfers a logic high level to the transfer gate 334 regardless of the level of the input data D. Also, the inverter latch 336 is reset by a set signal SETB. When the set signal SETB is activated to a logic low level, the inverter latch 336 receives and outputs a logic low level value regardless of the output of the transfer gate 334.

Figure 9:
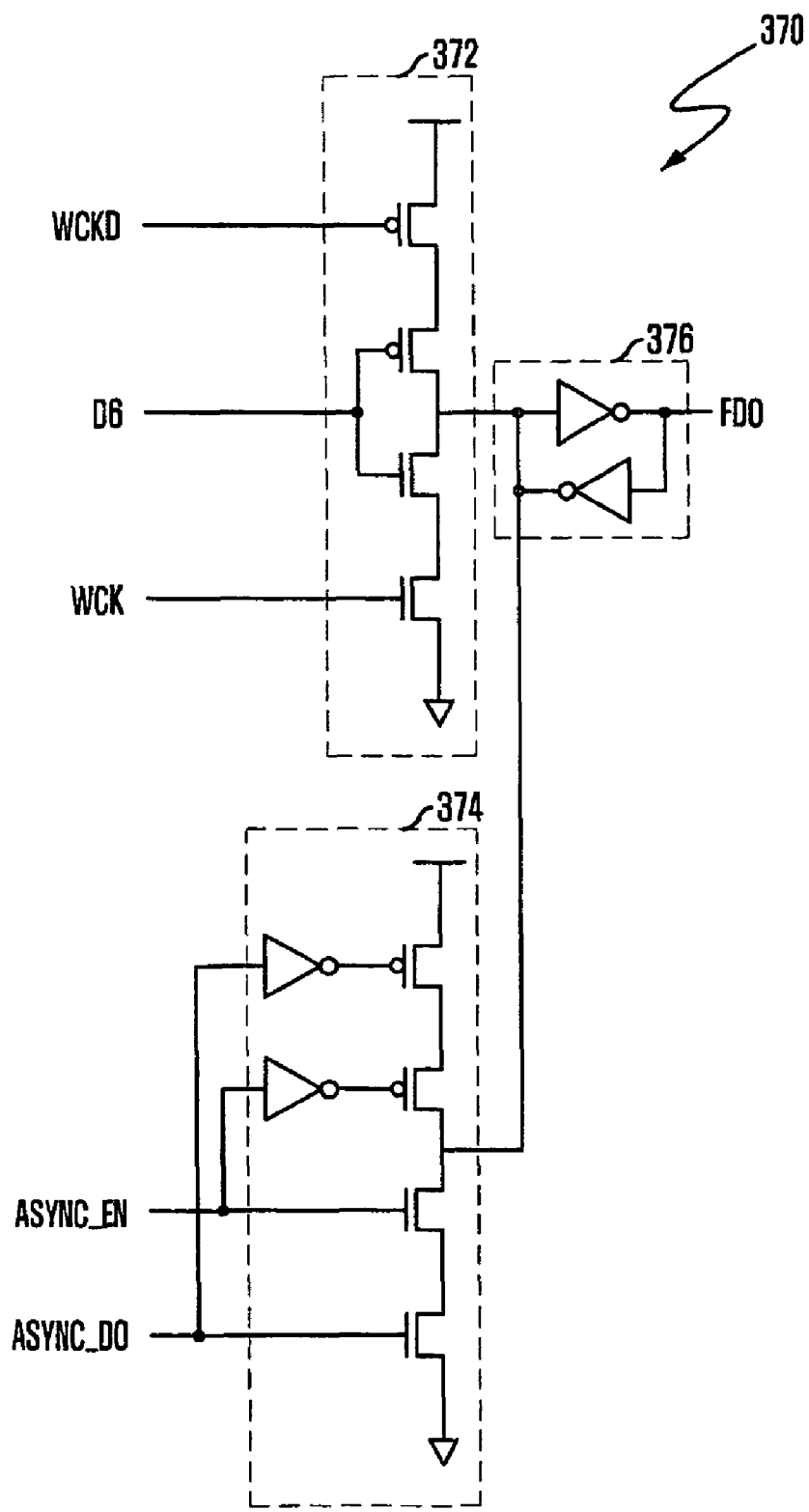
FIG. 9 is a circuit diagram of a fifth phase shifter illustrated in FIG. 3.

FIG. 9 is a circuit diagram of the fifth phase shifter 370 illustrated in FIG. 3.

Referring to FIG. 9, the fifth phase shifter 370 is configured to shift the phase of data D6 output from the fourth latch unit 360B in response to the data clock WCK, or to output random data, which are not synchronized to the system clock or the data clock WCK, in a test operation or in a training operation.

Specifically, the fifth phase shifter 370 includes a data inverter 372, an asynchronous data generator 374, and an inverter latch 376. The data inverter 372 is configured to invert data in synchronization with the data clock WCK. The asynchronous data generator 374 is configured to output random data in a test operation or in a training operation. The inverter latch 376 is configured to latch the output of the data inverter 372 and the output of the asynchronous data generator 374 and output an inversion signal. The data inverter 372 inverts the input data D6 in synchronization with a rising edge of the data clock WCK. The inverter latch 376 inverts data received from the data inverter 372 and outputs the inverted data to the fifth multiplexer 380. The fifth multiplexer 380 receives data output from the fifth phase shifter 370 in synchronization with a rising edge of the data clock WCK, and outputs the received data to the outside in response to a falling edge of the data clock WCK.

On the other hand, in a test operation or a training operation where internal data are not output, an asynchronous enable signal ASYNC_EN and an asynchronous start signal ASYNC_D0 are activated so that the fifth phase shifter 370 may output random data. At this point, the data clock WCK is deactivated to a logic low level.

A method for operating a semiconductor memory device in accordance with an embodiment of the present invention includes: a first serialization operation of partially serializing input 8-bit parallel data, which are received from internal unit cells in response to a read command, to output first to fourth serial data; a second serialization operation of partially serializing the first to fourth serial data to output fifth and sixth serial data; and a third serialization operation of serializing the fifth and sixth serial data to output seventh serial data. Herein, the data window UI of each data in the first to fourth serial data output in the first serialization operation is four times the data window UI of each data in the seventh serial data output in the third serialization operation; and the data window UI of each data in the fifth and sixth serial data output in the second serialization operation is two times the data window UI of each data in the seventh serial data output in the third serialization operation.

Specifically, the first serialization operation includes: an operation of shifting the phase of a portion (e.g., 4-bit data) of the 8-bit parallel data four times the data window UI of each data in the seventh serial data; an operation of multiplexing the other portion (e.g., 4-bit data) of the 8-bit parallel data and the phase-shifted 4-bit data to output the first to fourth serial data; and an operation of latching the first to fourth serial data.

The second serialization operation includes: an operation of shifting the phase of a portion (e.g., the first and third serial data) of the first to fourth serial data two times the data window UI of each data in the seventh serial data; an operation of multiplexing the other portion (e.g., the second and fourth serial data) of the first to fourth serial data and the phase-shifted first and third serial data to output the fifth and sixth serial data; and an operation of latching the fifth and sixth serial data.

The third serialization operation includes: an operation of shifting the phase of a portion (e.g., the fifth serial data) of the fifth and sixth serial data by the data window UI of each data in the seventh serial data; and an operation of multiplexing the other portion (e.g., the sixth serial data) of the fifth and sixth serial data and the phase-shifted fifth serial data to output the seventh serial data. In a test operation or a training operation, the third serialization operation further includes an operation of outputting random data, which are not synchronized with a system clock, to the outside.

As described above, the data output circuit in the semiconductor memory device in accordance with an embodiment of the present invention serializes a plurality of data that are output in parallel 1.5 tCK earlier than a data output time point (i.e., a time point of the CAS latency CL after application of the read command), thereby making it possible to output data in response to a high-frequency system clock and a data clock. Particularly, a graphic semiconductor memory device requiring high-speed data input/output can operate in response to a high-frequency system clock, thus increasing the product competitiveness.

Also, although the present invention has been described in terms of the data output circuit in the semiconductor memory device, it is also applicable to communication/network devices that serialize a plurality of parallel input data.

In general, a semiconductor memory device maintains an output terminal of an input/output signal pad DQ to be in a high-impedance (Hi-z) state, in order to interrupt a leakage current to reduce power consumption and in order to interrupt an unnecessary current flow to reduce malfunction and damage. That is, before/after the semiconductor memory device outputs a data strobe signal DQS through the input/output signal pad DQ, or before/after an external signal is received, the output terminal of the input/output signal pad DQ maintains a high-impedance (Hi-z) state. If an output signal is applied to the high-impedance output terminal of the input/output signal pad DQ, a predetermined time is required until the level of the high-impedance output terminal changes to the logic level of the first applied output signal. For this reason, the output timing of the first input/output signal DQS output through each input/output signal pad DQ of the semiconductor memory device may be deformed or distorted due to a delay, thus reducing the reliability of the operation of the semiconductor memory device. In order to overcome this problem, before an output signal is output through the output terminal of the input/output signal pad DQ, the semiconductor memory device changes the level of the output terminal into a logic low level or a logic high level, not a high-impedance (Hi-z) state, which signal is called a preamble.

As an example, a DDR, DDR2 or DDR3 semiconductor memory device implements the above-described preamble with respect to a data strobe signal DQS. The data strobe signal DQS is used to indicate that data output through a plurality of data pads DQ of the semiconductor memory device are valid values. The data strobe signal DQS must be able to be output at a predetermined precise time point. However, if there is a delay in transferring the data strobe signal DQS exiting from the high-impedance state, a valid window of the first data may become smaller than that of the subsequent output data and thus a preamble is implemented to such a problem.

However, as the data input/output speed of the semiconductor memory device increases, it is difficult to satisfy an accurate data input/output time point only by implementing a preamble for only the data strobe signal DQS. If a preamble is implemented not only for the data strobe signal DQS but also for a plurality of data output pads DQ, the first output data may be less affected by an inter-symbol interference (ISI), like the subsequent output data, and the valid window cannot be secured.

Therefore, the present invention provides an operation mode for selectively implementing a preamble also for the data pad DQ.

Figure 10:
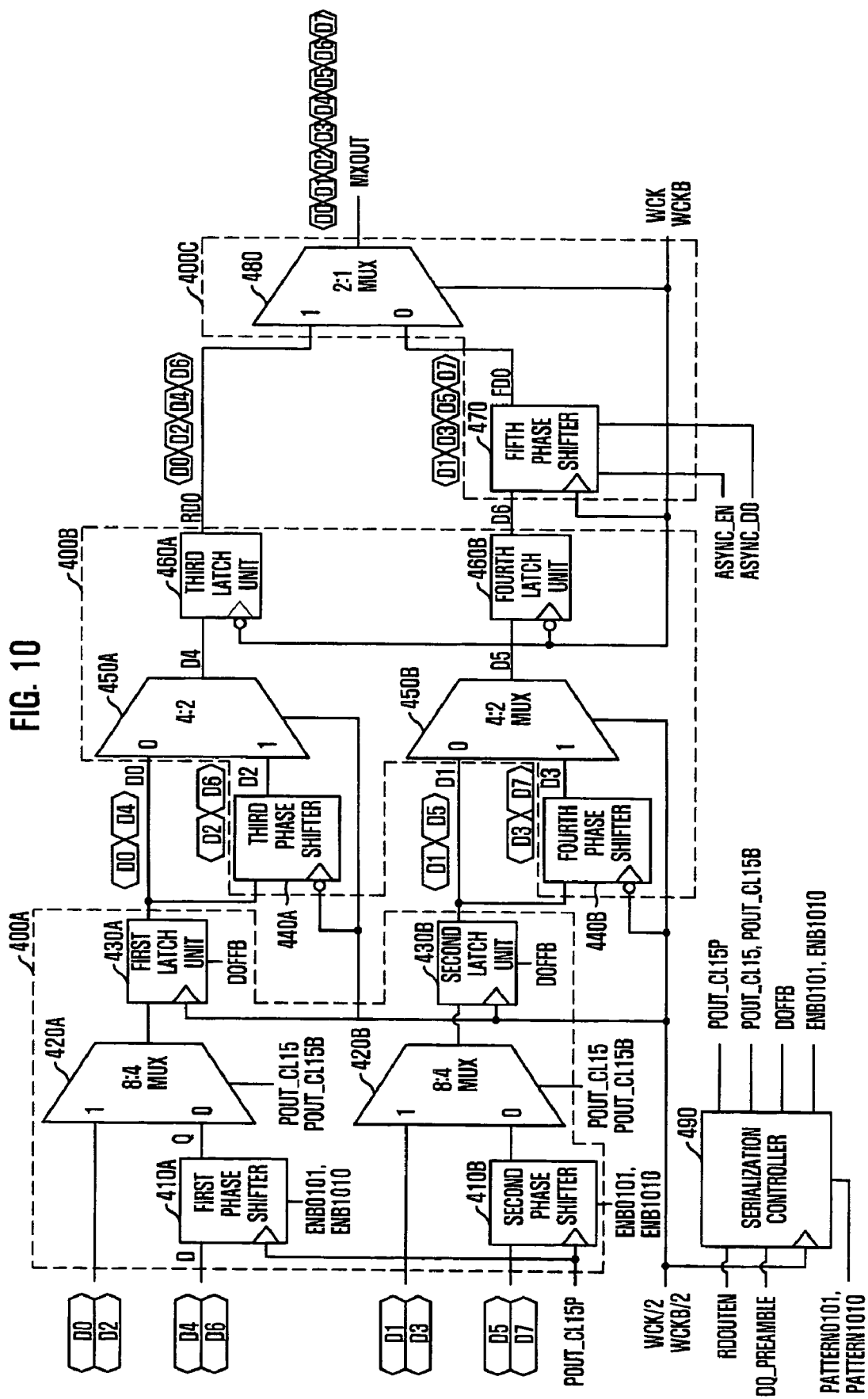
FIG. 10 is a block diagram of a data output circuit of a semiconductor memory device in accordance with another embodiment of the present invention.

FIG. 10 is a block diagram of a data output circuit of a semiconductor memory device in accordance with another embodiment of the present invention.

Referring to FIG. 10, the data output circuit includes a first serializer 400A, a second serializer 400B, and a third serializer 400C. The first serializer 400A is configured to partially serialize input 8-bit parallel data to output first to fourth serial data and to add preamble data to each of the first to fourth serial data according to an operation mode. The second serializer 400B is configured to receive the output of the first serializer 400A to output fifth and sixth serial data. The third serializer 400C is configured to receive the output of the second serializer 400B to output seventh serial data.

Herein, the first serializer 400A includes first and second phase shifters 410A and 410B, first and second multiplexers 420A and 420B, and first and second latch units 430A and 430B. The first and second phase shifters 410A and 410B are configured to shift the phases of 4-bit data D4 to D7 among 8-bit data D0 to D7 four times (i.e., 4 UI) the data window UI of each data in the seventh serial data after outputting the preamble data according to an operation mode. The first and second multiplexers 420A and 420B are configured to multiplex the other 4-bit data D0 to D3 among the 8-bit data D0 to D7 and the outputs of the first and second phase shifters 410A and 410B to output first to fourth serial data. The first and second latch units 430A and 430B are configured to latch the outputs of the first and second multiplexers 420A and 420B.

When the preamble data are not output, the operation of the data output circuit is as follows. The first multiplexer 420A serializes odd-numbered data D0, D2, D4 and D6 among the 8-bit parallel data D0 to D7 into two pairs of 2-bit data. To this end, the first phase shifter 410A shifts the phases of 2-bit data D4 and D6 among the odd-numbered data D0, D2, D4 and D6 by delaying the 2-bit data D4 and D6 by the window 4 UI of the data aligned by the first and second multiplexers 420A and 420B. Likewise, the second phase shifter 410B and the second multiplexer 420B are used to serialize even-numbered data D1, D3, D5 and D7 among the 8-bit parallel data D0 to D7 into two pairs of 2-bit data. The 4-bit data of two pairs of 2-bit data output from the first and second multiplexers 420A and 420B are latched respectively by the first and second latch units 430A and 430B. Herein, the window of each data in the 4-bit serial data output from the first and second latch units 430A and 430B is four times (i.e., 4 UI) the window of each data in the seventh serial data output from the third serializer 400C.

The second serializer 400B receives the first to fourth serial data output from the first and second latch units 430A and 430B. The second serializer 400B includes third and fourth phase shifters 440A and 440B, third and fourth multiplexers 450A and 450B, and third and fourth latch units 460A and 460B. The third and fourth phase shifters 440A and 440B are configured to shift the phases of a portion, e.g., the second and fourth serial data D2, D6 and D3, D7 among the first to fourth serial data two times (i.e., 2 UI) the data window UI of each data in the seventh serial data. The third and fourth multiplexers 450A and 450B are configured to multiplex the other portion, e.g., the first and third serial data D0, D4 and D1, D5 among the first to fourth serial data and the outputs of the third and fourth phase shifters 440A and 440B to output fifth and sixth serial data D0, D2, D4, D6 and D1, D3, D5, D7. The third and fourth latch units 460A and 460B are configured to latch the outputs of the third and fourth multiplexers 450A and 450B.

Specifically, the third and fourth phase shifters 440A and 440B delay the second and fourth serial data D2, D6 and D3, D7 among the first to fourth serial data, which are output from the first and second latch units 430A and 430B of the first serializer 400A, by using division clocks WCK/2 and WCKB/2 that are obtained by dividing data clocks WCK and WCKB at a division ratio of 1/2. Herein, the data clocks WCK and WCKB are used as a criterion for output of the seventh serial data. The frequency of the data clocks WCK and WCKB is two times higher than the frequency of a system clock, and the newly-proposed semiconductor memory device outputs two data for one cycle of the data clocks WCK and WCKB. That is, the data window UI of each data in the seventh serial data is half of the cycle of the data clocks WCK and WCKB.

The third phase shifter 440A and the fourth phase shifter 440B use the division clocks WCK/2 and WCKB/2, whose cycle is four times the data window UI of each data in the seventh serial data, to delay the phases of the second and fourth serial data D2, D6 and D3, D7 two times the data window UI of each data in the seventh serial data. Thereafter, the third and fourth multiplexers 450A and 450B output fifth and sixth serial data D0, D2, D4, D6 and D1, D3, D5, D7 by multiplexing the two data D2, D6 and D3, D7 delayed by the third and fourth phase shifters 440A 440B, and the non-delayed two data D0, D4 and D1, D5, among the first to fourth serial data output from the first and second latch units 430A and 430B. Finally, the third and fourth latch units 460A and 460B latch and transfer the outputs of the third and fourth multiplexers 450A and 450B to the third serializer 400C.

The third serializer 400C includes a fifth phase shifter 470 and a fifth multiplexer 480. The fifth phase shifter 470 is configured to shift the phase of the fifth serial data D1, D3, D5, D7 among the fifth and sixth serial data D0, D2, D4, D6 and D1, D3, D5, D7 by the data window UI of each data in the seventh serial data. The fifth multiplexer 480 is configured to multiplex the sixth serial data D0, D2, D4, D6 among the fifth and sixth serial data D0, D2, D4, D6 and D1, D3, D5, D7 and the output of the fifth phase shifter 470 to output the seventh serial data D0, D1, D2, D3, D4, D5, D6, D7.

The data output circuit further includes a serialization controller 490. The serialization controller 490 is configured to output a first control pulse POUT_CL15P, a second control pulse POUT_CL15, and a data transfer signal DOFFB in response to a read data output signal RDOUTEN and the division clock WCK/2 of the data clock WCK. The read data output signal RDOUTEN is used to enable data output in response to a read command, and the division clock WCK/2 of the data clock WCK is used as a criterion for the data output. The first control pulse POUT_CL15P is used to control the first and second phase shifters 410A and 410B of the first serializer 400A; the second control pulse POUT_CL15 is used to control the first and second multiplexers 420A and 420B; and the data transfer signal DOFFB is used to control the first and second latch units 430A and 430B.

On the other hand, when the preamble data are output, the operation of the data output circuit is as follows. First, when a preamble signal DQ_PREAMBLE is activated, the serialization controller 490 activates a first pattern enable signal EN0101 or a second pattern enable signal EN1010 in response to a first pattern signal PATTERN0101 or a second pattern signal PATTERN1010. Herein, the first pattern signal PATTERN0101 and the second pattern signal PATTERN1010 are used to determine the configuration of preamble data. Specifically, when the first pattern signal PATTERN0101 is activated, the data output circuit outputs four preamble data corresponding to '0101' before the seventh serial data D0, D1, D2, D3, D4, D5, D6, D7 are output from the fifth multiplexer 480. Also, when the second pattern signal PATTERN1010 is activated, the data output circuit outputs four preamble data corresponding to '1010' before the seventh serial data D0, D1, D2, D3, D4, D5, D6, D7 are output from the fifth multiplexer 480.

In order to output the four preamble data corresponding to '0101' in response to the first pattern signal PATTERN0101, the first phase shifter 410A outputs two preamble data corresponding to '0' and then shifts the phases of 2-bit parallel data D4 and D6 to transfer the phase-shifted data. At this point, the second phase shifter 410B outputs two preamble data corresponding to '1' and then shifts the phases of 2-bit parallel data D5 and D7 to transfer the phase-shifted data. The first multiplexer 420A transfers the two preamble data corresponding to '0' before the first output data D0 in synchronization with a rising edge of the data clock WCK, and the second multiplexer 420B transfers the two preamble data corresponding to '1' before the first output data D0 in synchronization with a falling edge of the data clock WCK. The four preamble data received from the first and second multiplexers 420A and 420B are aligned by the second serializer 400B and the third serializer 400C so that they are output before the initial output data D0.

On the other hand, when the second pattern signal PATTERN1010 is activated, the first phase shifter 410A outputs two preamble data corresponding to '1' before shifting the phases of 2-bit parallel data D4 and D6, in order to output four preamble data corresponding to '1010'. Also, the second phase shifter 410B outputs two preamble data corresponding to '0' before shifting the phases of 2-bit parallel data D5 and D7.

Thus, the data output circuit can output 4-bit preamble data corresponding to '1010' in the same way as for outputting 4-bit preamble data corresponding to '0101'.

Figure 11:
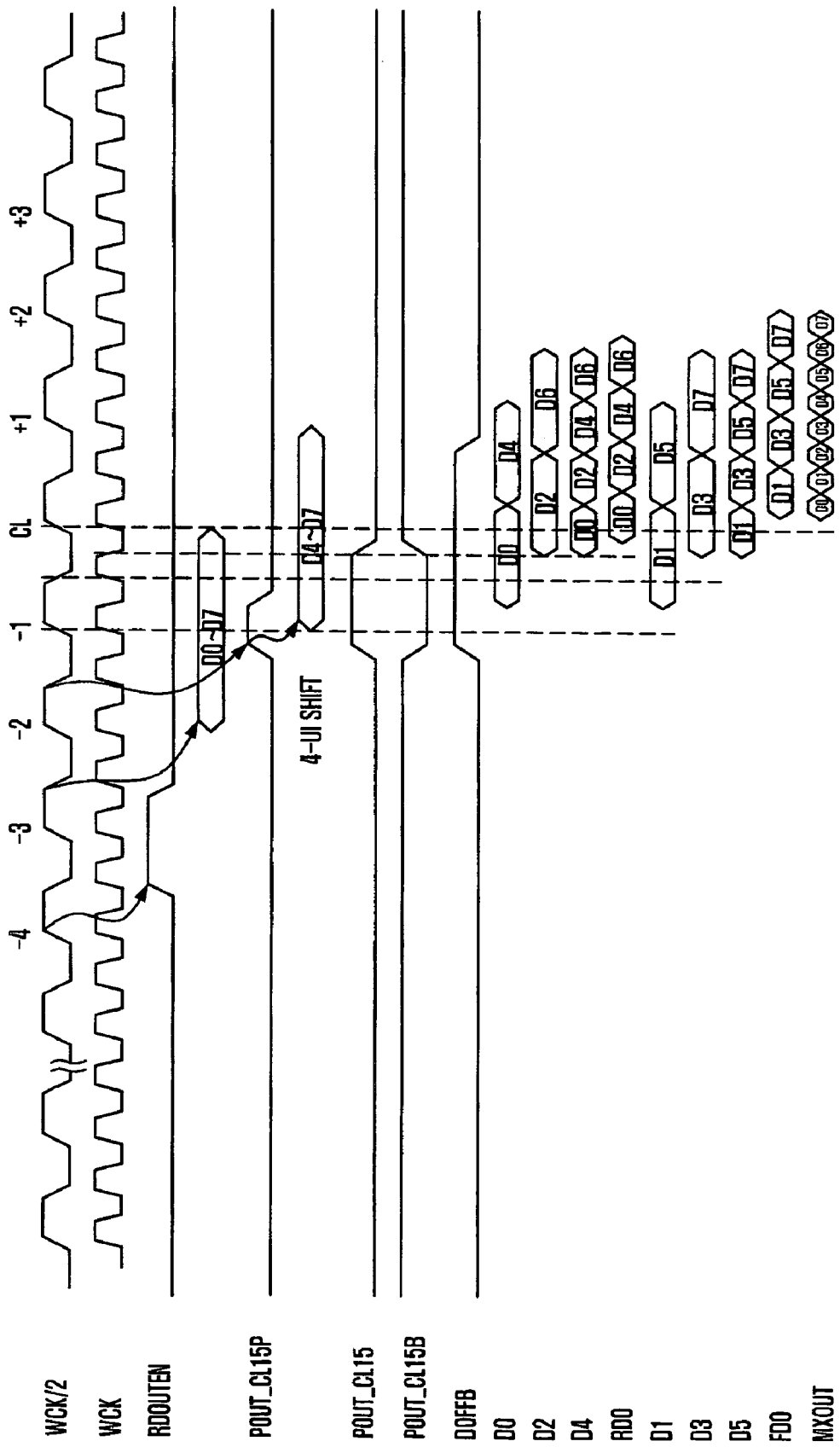
FIG. 11 is a waveform diagram illustrating the operation of the semiconductor memory device illustrated in FIG. 10.

FIG. 11 is a waveform diagram illustrating the operation of the semiconductor memory device illustrated in FIG. 10. Specifically, the operation of the semiconductor memory device not outputting the preamble data is described in terms of the data clock WCK and the division clock WCK/2, and FIG. 11 illustrates an exemplary case of a semiconductor memory device of the present invention where the frequency of a division clock WCK/2 is equal to the frequency of a system clock and four data are output for one clock tCK of the system clock.

Referring to FIG. 11, the semiconductor memory device outputs the seventh serial data D0, D1, D2, D3, D4, D5, D6, D7 from the time point of the CAS latency CL after application of the read command. Specifically, the semiconductor memory device activates the read data output signal RDOUTEN corresponding to the read command at the time point 4 tCK (i.e., four cycles of the system clock) earlier than the CAS latency CL. Thereafter, the serialization controller 490 of the data output circuit generates a plurality of signals for control of the first serializer 400A in response to the read data output signal RDOUTEN. In addition, the multi-bit data D0 to D7 output from the internal unit cells are transferred to the data output circuit at the time point 2.5 tCK earlier than the CAS latency CL.

The multi-bit data D0 to D7 are transferred in parallel to the data output circuit. The data output circuit serializes the input multi-bit parallel data D0 to D7 to output the seventh serial data D0, D1, D2, D3, D4, D5, D6, D7. First, the serialization controller 490 activates the first control pulse POUT_CL15P at the time point 1.5 tCK earlier than the CAS latency CL in response to the read data output signal RDOUTEN. The first and second phase shifters 410A and 410B of the first serializer 400A delay the 4-bit data D4 to D7 among the multi-bit data D0 to D7 by 1 tCK (i.e., 4 UI) in response to the activated first control pulse POUT_CL15P.

Also, the serialization controller 490 activates the second control pulse POUT_CL15 to a logic high level at the time point 1.5 tCK earlier than the CAS latency CL, like the first control pulse POUT_CL15P. At this point, an inversion signal POUT_CL15B of the second control pulse POUT_CL15 becomes a logic low level. In response to the second control pulse POUT_CL15 and the inversion signal of the POUT_CL15B of the second control pulse POUT_CL15, the first and second multiplexers 420A and 420B serialize the input parallel 4-bit data D0 to D3 and the other 4-bit data D4 to D7 whose phases are shifted by the first and second phase shifters 410A and 410B. After the first to fourth serial data D0, D4 and D2, D6 and D1, D5 and D3, D7 are generated by the first and second multiplexers 420a and 420B, the first and second latch units 430A and 430B transfer the first to fourth serial data D0, D4 and D2, D6 and D1, D5 and D3, D7 to the second serializer 400B in response to the data transfer signal DOFFB output from the serialization controller 490.

The second and fourth serial data D2, D6 and D3, D7 among the first to fourth serial data transferred to the second serializer 400B are delayed by the third and fourth phase shifters 440A and 440B by 0.5 tCK (i.e., 2 UI). Thereafter, the third and fourth multiplexers 450A and 450B receive four serial data, that is, the second and fourth serial data delayed by the third and fourth phase shifters 440A and 440B and the non-delayed first and third serial data output from the first and second latch units 430A and 430B, and serialize the received serial data into the fifth and sixth serial data. The fifth and sixth serial data are transferred respectively through the third and fourth latch units 460A and 460B to the third serializer 400C. In particular, the third and fourth latch units 460A and 450B transfer the corresponding data 0.25 tCK earlier than the CAS latency CL in response to a falling edge of the data clock WCK. Referring to FIG. 11, the operation of the second serializer 400B can be seen from the first to fourth serial data D0, D4 and D2, D6 and D1, D5 and D3, D7 transferred to the input terminals d0, d1, d2 and d3 of the third and fourth multiplexers 450A and 450B and the fifth and sixth serial data D0, D2, D4, D6 and D1, D3, D5, D7 output through the output terminals d4 and d5 of the third and fourth multiplexers 450A and 450B. The phase of the data D1, D3, D5, D7 transferred through the fourth latch unit 460B to the third serializer 400C is delayed by UI corresponding to the fifth phase shifter 470. When transferred through the third latch unit 460A to the fifth multiplexer 480 in synchronization with a falling edge of the data clock WCK 0.25 tCK (i.e., the half cycle of the data clock WCK) earlier than the CAS latency CL, the data D0, D2, D4, D6 (i.e., RDO) start to be output by the fifth multiplexer 480 in synchronization with a rising edge of the data clock WCK. On the other hand, the other data D1, D3, D5, D7 (i.e., FDO) delayed by the fifth phase shifter 470 are transferred to the fifth multiplexer 480 in synchronization with a rising edge of the data clock WCK and then start to be output by the fifth multiplexer 480 in synchronization with a falling edge of the data clock WCK. Through the above-described operations, the 8-bit parallel data D0 to D7, which are received in parallel from the time point of the CAS latency CL after application of the read command, are serialized by the data output circuit into the seventh serial data D0, D1, D2, D3, D4, D5, D6, D7 that are output sequentially.

Figure 12:
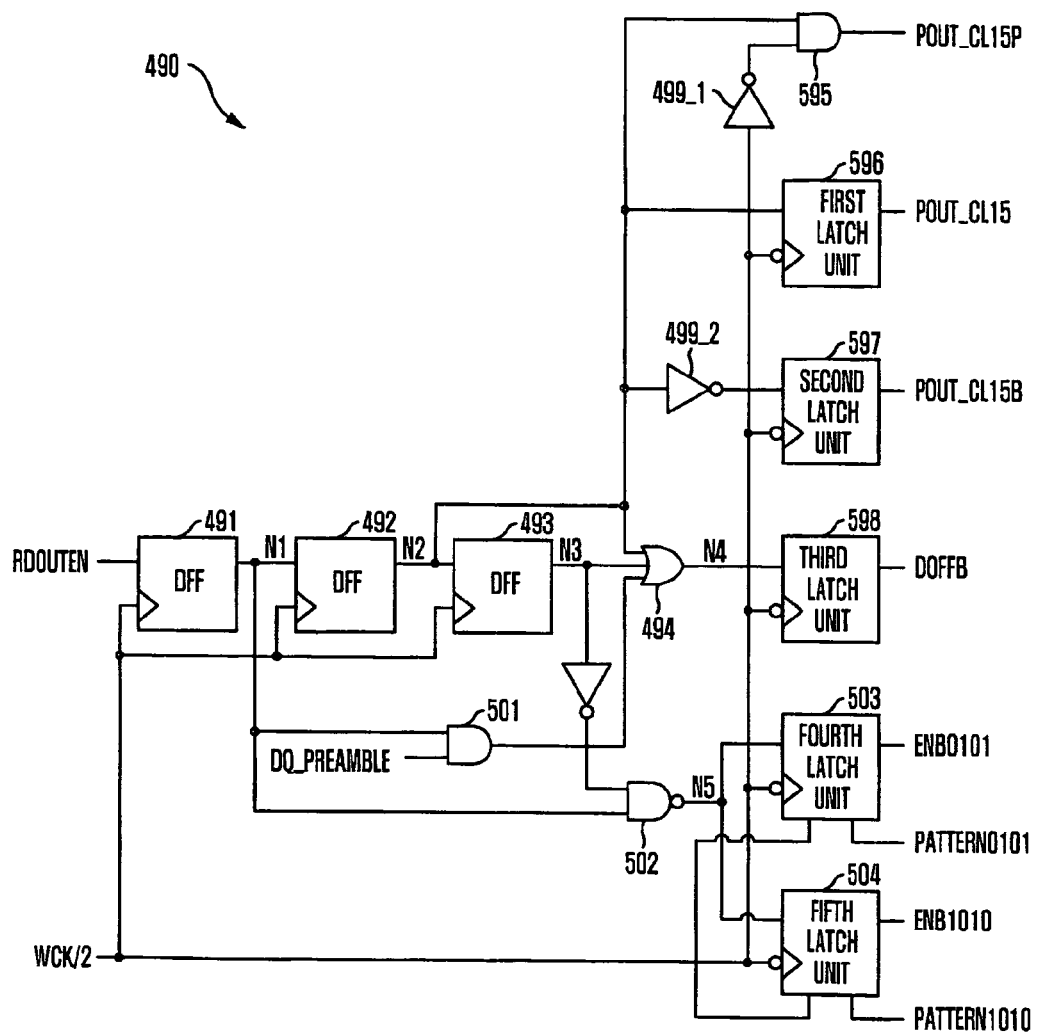
FIG. 12 is a block diagram of a serialization controller illustrated in FIG. 10.

FIG. 12 is a block diagram of the serialization controller 490 illustrated in FIG. 10.

Referring to FIG. 12, the serialization controller 490 includes a plurality of flip-flops 491, 492 and 493 and first to fifth latches 596, 597, 598, 503 and 504 that are configured to the output the first control pulse POUT_CL15P, the second control pulses POUT_CL15 and POUT_CL15B, the data transfer signal DOFFB, and first and second preamble enable signals ENB0101 and ENB1010 in response to the read data output signal RDOUTEN and the division clock WCK/2.

Specifically, the first latch 596 outputs the first control pulse POUT_CL15P for controlling the first and second phase shifters 410A and 410B in response to the read data output signal RDOUTEN, and the second latch 597 outputs the second control pulses POUT_CL15 and POUT_CL15B having an activation period of two times (i.e., 1 tCK) longer the cycle of the data clock WCK for controlling the first and second multiplexers 420A and 420B. The third latch 598 outputs the data transfer signal DOFFB that has an activation period of four times (i.e., 2 tCK) longer than the cycle of the data clock WCK. When the preamble signal DQ_PREAMBLE is activated, the fourth and fifth latches 503 and 504 output the first and second pattern enable signals ENB0101 and ENB1010 in response to the first and second pattern signals PATTERN0101 and PATTERN1010.

Specifically, when the read data output signal RDOUTEN is activated to a logic high level at a time point CL-4 earlier than the CAS latency CL by four cycles of the system clock, the flip-flops 491, 492 and 493 shift the phase of the read data output signal RDOUTEN in response to the division clock WCK/2.

An output terminal N1 of the first flip-flop 491 is enabled to a logic high level at a time point CL-3 earlier than the CAS latency CL by three cycles of the system clock. Thus, a NAND gate 502 outputs a logic low level by NAND-operating the logic level of the output terminal N1 of the first flip-flop 491 and the output of a third inverter 505 for inverting the logic level of an output terminal N3 of the third flip-flop 493. When the first and second pattern signals PATTERN0101 and PATTERN1010 are activated, the fourth and fifth latches 503 and 504 receive the output of the NAND gate 502 to activate the first and second pattern enable signals ENB0101 and ENB1010 to a logic low level. Also, the third latch 598 activates the data transfer signal DOFFB in response to the output of an AND gate 501 that AND-operates the preamble signal DQ_PREAMBLE and the logic level of the output terminal N1 of the first flip-flop 491 at the time point CL-3 earlier than the CAS latency CL by three cycles of the system clock.

Thereafter, an output terminal N2 of the second flip-flop 492 is enabled to a logic high level at a time point CL-2 earlier than the CAS latency CL by two cycles of the system clock. At this point, an AND gate 595 activates the first control pulse POUT_CL15P at a time point of the division clock WCK/2 inverted by a first inverter 499_1, that is, at a falling edge of the division clock WCK/2. At this point, the first control pulse POUT_CL15P has an activation period as long as the cycle of the data clock WCK.

After the output terminal N2 of the second flip-flop 492 is enabled to a logic high level, the first latch 596 generates the second control pulse POUT_CL15 in response to a falling edge of the division clock WCK/2. On the other hand, the second latch 597, which has received the output of a second inverter 499_2 obtained by inversion of the output terminal N2 of the second flip-flop 492, generates an inversion signal POUT_CL15B of the second control pulse POUT_CL15 in response to a falling edge of the division clock WCK/2. Herein, the second control pulse POUT_CL15 and the inversion signal POUT_CL15B of the second control pulse POUT_CL15 may have an activation period as long as 1 tCK (i.e., one cycle of the system clock) due to the first and second latches 596 and 597 that operate in response to a falling edge of the division clock WCK/2.

Together with the activation of the second control pulse POUT_CL15, the data transfer signal DOFFB is also generated by the third latch 598 that operates in response to a falling edge of the division clock WCK/2. However, the third latch 598 can output the data transfer signal DOFFB having an activation period four times longer than the second control pulse POUT_CL15, by receiving the outputs of the AND gate 501 and the second and third flip-flops 492 and 493 through an OR gate 494.

Figure 13:
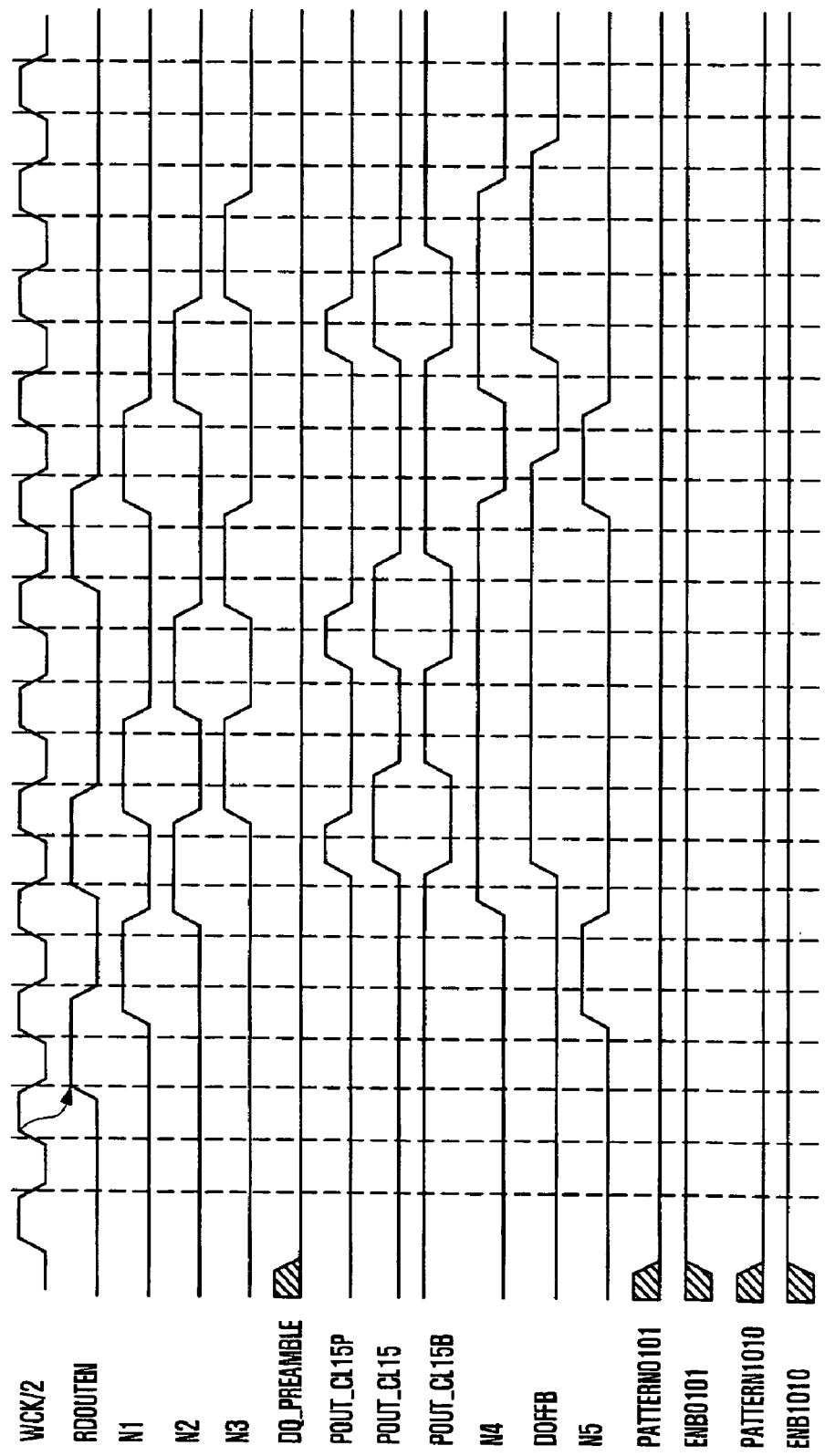
FIG. 13 is a waveform diagram illustrating the operation of the serialization controller of FIG. 12 when a preamble signal is deactivated.

FIG. 13 is a waveform diagram illustrating the operation of the serialization controller 490 of FIG. 12 when the preamble signal DQ_PREAMBLE is deactivated. Specifically, FIG. 13 illustrates signals that are output from the serialization controller 490 when the preamble signal DQ_PREAMBLE is deactivated.

Referring to FIG. 13, the serialization controller 490 generates a plurality of signals on the basis of the division clock WCK/2 in response to the read data output signal RDOUTEN. First, when the read data output signal RDOUTEN is activated, the flip-flops 491, 492 and 493 delay the phase by the cycle of the division clock WCK/2 (see the output terminals N1, N2 and N3 of the flip-flops 491, 492 and 493). Thereafter, the first and second latches 596 and 597 of the serialization controller 490 generate the first and second control pulses POUT_CL15P, POUT_CL15 and POUT_CL15B in response to a falling edge of the division clock WCK/2. Also, the OR gate 494 OR-operates the outputs of the second and third flip-flops 492 and 493 to transfer an output pulse with a two-time activation period to the third latch 598 through an output terminal N4, and the third latch 598 outputs the data transfer signal DOFFB in response to a falling edge of the division clock WCK/2. On the other hand, when the preamble signal DQ_PREAMBLE is deactivated, the fourth and fifth latches 503 and 504 output the first and second pattern enable signals ENB0101 and ENB1010 deactivated to a logic high level regardless of the output of the NAND gate 502.

Figure 14:
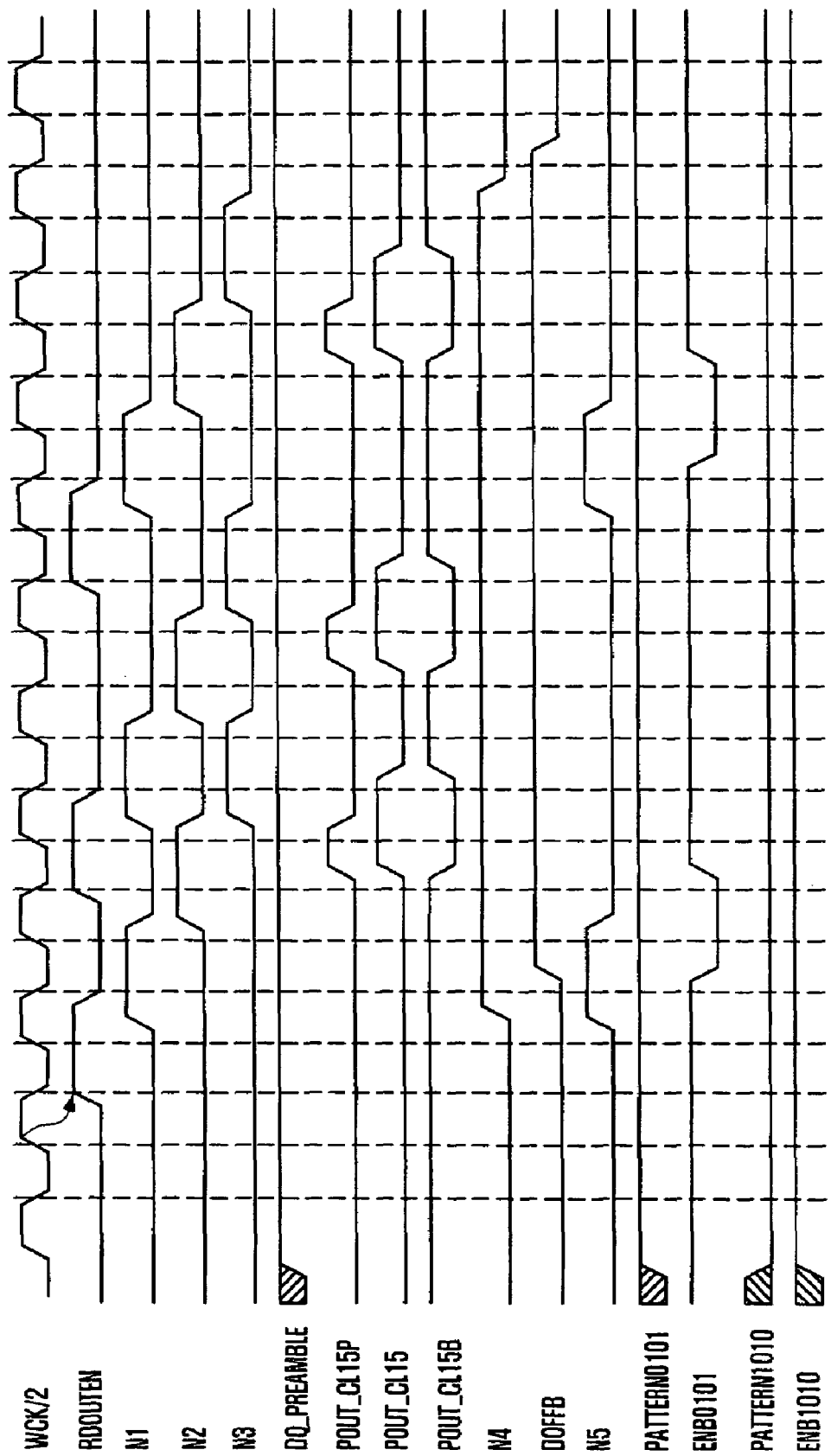
FIG. 14 is a waveform diagram illustrating the operation of the serialization controller of FIG. 12 when a preamble is implemented in a first pattern.

FIG. 14 is a waveform diagram illustrating the operation of the serialization controller 490 of FIG. 12 when the preamble is implemented in the first pattern '0101'.

Referring to FIG. 14, the serialization controller 490 receives not only the activated read data output signal RDOUTEN but also the first pattern signal PATTERN0101 and the preamble signal DQ_PREAMBLE activated to a logic high level. The first and second control pulses POUT_CL15P, POUT_CL15 and POUT_CL15B, which are activated in response to the read data output signal RDOUTEN, are generated in the same way as described with reference to FIG. 13.

On the other hand, when the preamble signal DQ_PREAMBLE and the first pattern signal PATTERN0101 are activated and input, the output terminal N5 of the NAND gate 502 also changes into a logic high level at the time when the output terminal N1 of the first flip-flop 491 changes into a logic high level in response to the read data output signal RDOUTEN. Upon receiving the logic high level, the fourth latch 503 outputs the first pattern enable signal ENB0101 to the first and second phase shifters 410A and 410B in response to the first pattern signal PATTERN0101. In response to the activated first pattern enable signal ENB0101, the first phase shifter 410A outputs preamble data of a logic low level to the first multiplexer 420A, and the second phase shifter 410B outputs preamble data of a logic high level to the second multiplexer 420B.

Also, unlike the operation of FIG. 13 with the deactivated preamble signal DQ_PREAMBLE, the AND gate 501 outputs a logic high level at the time point CL-3 earlier than the CAS latency CL by three cycles of the system clock in response to the activation of the preamble signal DQ_PREAMBLE.

In response to the output of the AND gate 501, the third latch 598 activates the data transfer signal DOFFB in synchronization with the system clock. Of course, the data transfer signal DOFFB output from the third latch 598 in response to the output of the OR gate 494 may maintain an activation state till the time point earlier than the CAS latency CL by one cycle of the system clock. For reference, in FIG. 14, the activation state is maintained without a deactivation period due to the iteratively-activated read data output signal RDOUTEN.

Figure 15:
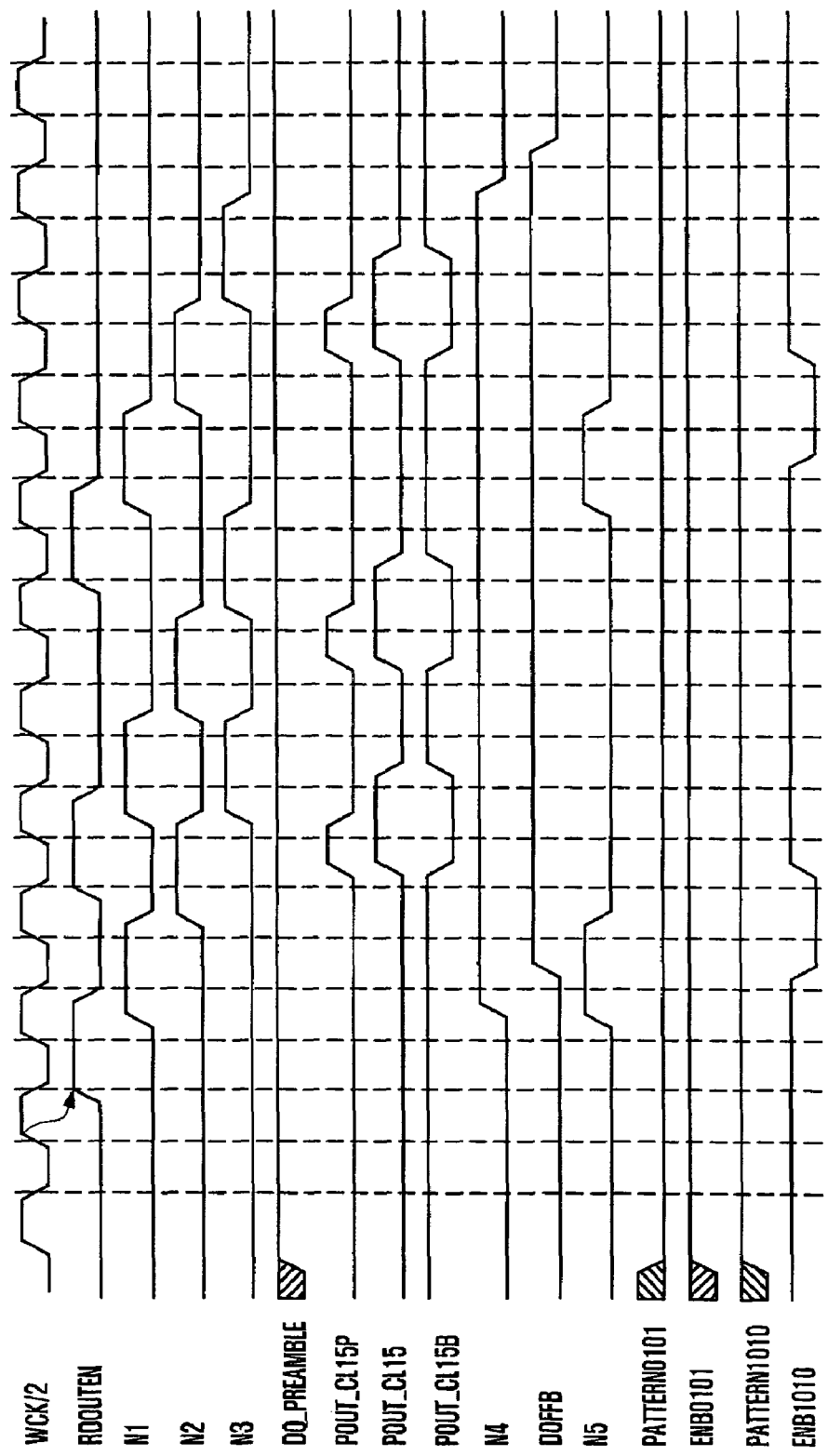
FIG. 15 is a waveform diagram illustrating the operation of the serialization controller of FIG. 12 when a preamble is implemented in a second pattern.

FIG. 15 is a waveform diagram illustrating the operation of the serialization controller 490 of FIG. 12 when the preamble is implemented in the second pattern '1010'.

Referring to FIG. 15, the serialization controller 490 receives not only the activated read data output signal RDOUTEN but also the second pattern signal PATTERN1010 and the preamble signal DQ_PREAMBLE activated to a logic high level. The first and second control pulses POUT_CL15P, POUT_CL15 and POUT_CL15B, which are activated in response to the read data output signal RDOUTEN, are generated in the same way as described with reference to FIG. 13. Also, the preamble signal DQ_PREAMBLE and the data transfer signal DOFFB activated in response to the read data output signal RDOUTEN are generated in the same way as described with reference to FIG. 14.

On the other hand, when the preamble signal DQ_PREAMBLE and the second pattern signal PATTERN1010 are activated and input, the output terminal N5 of the NAND gate 502 also changes into a logic high level at the time when the output terminal N1 of the first flip-flop 491 changes into a logic high level in response to the read data output signal RDOUTEN. Upon receiving the logic high level, the fifth latch 504 outputs the second pattern enable signal ENB1010 to the first and second phase shifters 410A and 410B in response to the second pattern signal PATTERN1010. In response to the activated second pattern enable signal ENB1010, the first phase shifter 410A outputs preamble data of a logic high level to the first multiplexer 420A, and the second phase shifter 410B outputs preamble data of a logic low level to the second multiplexer 420B.

Figure 16:
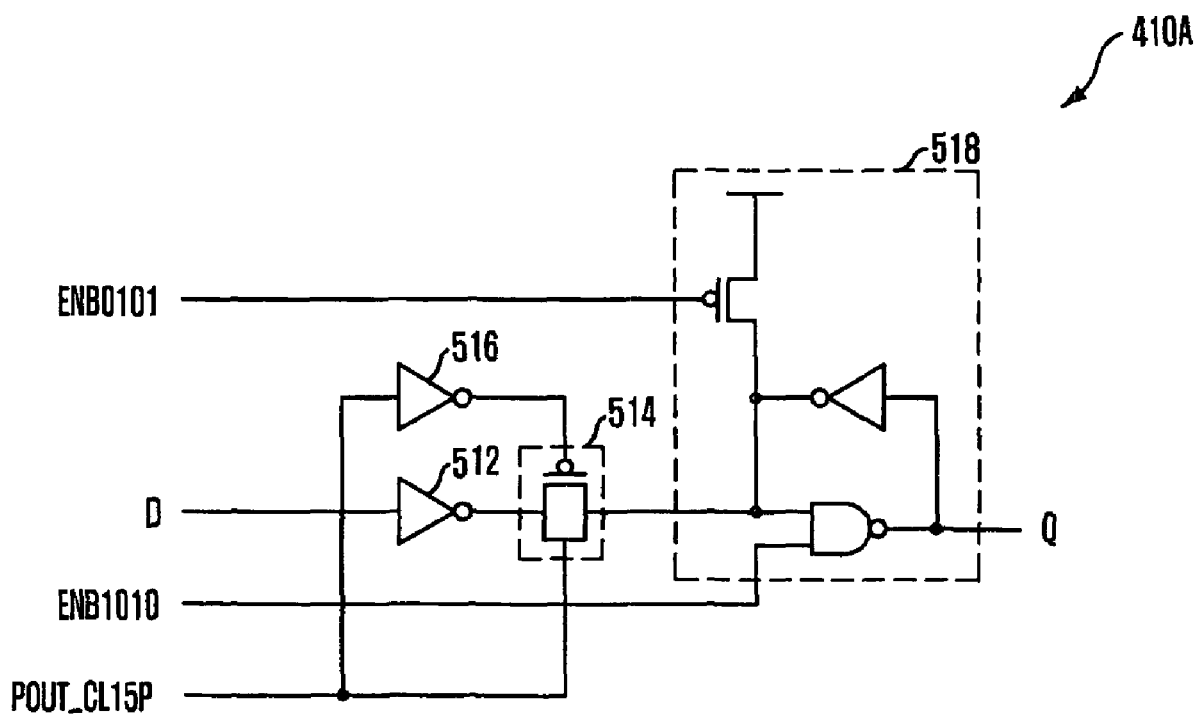
FIG. 16 is a circuit diagram of a first phase shifter illustrated in FIG. 10.

FIG. 16 is a circuit diagram of the first phase shifter 410A illustrated in FIG. 10.

Referring to FIG. 16, the first phase shifter 410A includes a plurality of unit latches that are configured to shift the phases of a plurality of parallel input data D4 and D6. Herein, the unit latch includes a fifth inverter 512, a transfer gate 514, and an inverter latch 518. The fifth inverter 512 is configured to invert input data D. The transfer gate 514 is configured to transfer the output of the fifth inverter 512 in response to the first control pulse POUT_CL15P. The inverter latch 518 is configured to latch and invert the output of the transfer gate 514. The unit latch further includes a sixth inverter 516 that is configured to invert the first control pulse POUT_CL15P in order to control the transfer gate 514.

The inverter latch 518 includes a MOS transistor, a NAND gate, and a seventh inverter. The MOS transistor is configured to transfer a logic high level in response to the first pattern enable signal ENB0101. The NAND gate is configured to invert the output of the transfer gate 514 and the output of the MOS transistor when the second pattern enable signal ENB1010 is deactivated to a logic high level, and to output preamble data of a logic high level when the second pattern enable signal ENB1010 is activated to a logic low level. The seventh inverter is configured to invert the output of the NAND gate to feed back the resulting data. That is, the inverter latch 518 outputs preamble data of a logic low level or a logic high level in response to the first pattern enable signal ENB0101 or the second pattern enable signal ENB1010 that is activated to a logic low level before transfer of data D that is input by activation of the first control pulse POUT_CL15P.

Although not illustrated, the components of the second phase shifter 410B are similar to the components of the first phase shifter 410A. The second phase shifter 410B is opposite to the first phase shifter 410A in terms of the input points of the first pattern enable signal ENB0101 and the second pattern enable signal ENB1010. Therefore, the second phase shifter 410B outputs preamble data having a level complementary to the level of the preamble data output from the first phase shifter 410A.

A method for operating a semiconductor memory device in accordance with another embodiment of the present invention includes: a first serialization operation of serializing input 8-bit parallel data, which are received from internal unit cells in response to a read command, to output first to fourth serial data, and adding preamble data to each of the first to fourth serial data to be output; a second serialization operation of serializing the first to fourth serial data to output fifth and sixth serial data; and a third serialization operation of serializing the fifth and sixth serial data to output seventh serial data.

Specifically, the first serialization operation includes: an operation of outputting the preamble data according to an operation mode and then shifting the phase of a portion of the 8-bit parallel data four times the data window UI of each data in the seventh serial data; an operation of multiplexing the other portion of the 8-bit parallel data and the phase-shifted data to output the first to fourth serial data; and an operation of latching the first to fourth serial data.

The second serialization operation includes: an operation of shifting the phase of a portion of the first to fourth serial data two times the data window UI of each data in the seventh serial data; an operation of multiplexing the other portion of the first to fourth serial data and the phase-shifted data to output the fifth and sixth serial data; and an operation of latching the fifth and sixth serial data.

The third serialization operation includes: an operation of shifting the phase of a portion of the fifth and sixth serial data by the data window UI of each data in the seventh serial data; and an operation of multiplexing the other portion of the fifth and sixth serial data and the phase-shifted data to output the seventh serial data. In a test operation or a training operation, the third serialization operation further includes an operation of outputting random data, which are not synchronized with a system clock, to the outside.

As described above, the data output circuit in the semiconductor memory device in accordance with an embodiment of the present invention serializes a plurality of data that are output in parallel 1.5 tCK earlier than a data output time point (i.e., a time point of the CAS latency CL after application of the read command), thereby making it possible to output data in response to a high-frequency system clock and a data clock. Particularly, a graphic semiconductor memory device requiring high-speed data input/output can operate in response to a high-frequency system clock, thus increasing the product competitiveness.

Also, although the present invention has been described in terms of the data output circuit in the semiconductor memory device, it is also applicable to communication/network devices that serialize a plurality of parallel input data. Also, the data output circuit beforehand outputs preamble data similar to actual data, thereby enabling the subsequent valid data to be transferred without distortion.

As described above, the present invention enables the data output circuit, which is used to serialize parallel output data in the semiconductor memory device, to secure a sufficient operation margin for data alignment. Thus, data corresponding to the read command can be output in response to an external clock with a high frequency, thereby making it possible to secure a high-speed operation of the semiconductor memory device.

Specifically, the semiconductor memory device in accordance with the embodiment of the present invention can perform a read operation in response to a clock signal with a high frequency of 5 Gbps or more. In particular, a graphic semiconductor memory device requiring high-speed data input/output can operate in response to a high-frequency system clock, thus increasing the product competitiveness.

Also, the present invention enables the data output circuit, which is used to serialize parallel output data in the semiconductor memory device, to selectively output a plurality of preamble patterns, thus making it possible to prevent a signal distortion from occurring due to delay or interference in a data output operation.

Specifically, the semiconductor memory device in accordance with the embodiment of the present invention makes it possible to selectively output a preamble pattern similar to actual output data before data output. Therefore, the effective window of the first output data can be secured and a preamble pattern can be implemented in common in a plurality of data pads. Thus, it is possible to prevent the skew between data signals that may be caused by a design process difference between the data pads.

While the present invention has been described with respect to the specific embodiments, it will be apparent to those skilled in the art that various changes and modifications may be made without departing from the spirit and scope of the invention as defined in the following claims.

What is claimed is:

1. A semiconductor memory device comprising: a first serializer configured to partially serialize input 8-bit parallel data, which are received from the internal unit cells in response to a read command, to output first to fourth serial data;
    a second serializer configured to partially serialize the first to fourth serial data to output fifth and sixth serial data; and
    a third serializer configured to serialize the fifth and sixth serial data to output seventh serial data,
    wherein the first serializer comprises:
    a first phase shifter configured to shift the phases of 4-bit data among the 8-bit parallel data four times a data window of each data in the seventh serial data;
    a first multiplexer configured to multiplex the other 4-bit data among the 8-bit parallel data and the output of the phase shifter to output the first to fourth serial data; and
    a first latch unit configured to latch the output of the multiplexer, and wherein the first phase shifter comprises:
a plurality of unit phase shifters configured to shift the phase of the 4-bit data, each of the unit phase shifters comprising:
an inverter configured to invert input data;
a transfer gate configured to transfer the output of the inverter in response to a first control pulse, and
an inverter latch configured to latch and invert the output of the transfer gate.

2. The semiconductor memory device as recited in claim 1, wherein a window of each data in the first to fourth serial data is four times the window of each data in the seventh serial data.

3. The semiconductor memory device as recited in claim 1, wherein the first latch unit comprises:
a plurality of unit latches configured to latch first to fourth serial data output from the multiplexer, each of the unit latches comprising:
a NAND gate configured to invert each data in the first to fourth serial data in response to a data transfer signal;
a transfer gate configured to transfer the output of the NAND gate at intervals of four times the data window of each data in the seventh serial data; and
an inverter latch configured to latch and invert the output of the transfer gate.

4. The semiconductor memory device as recited in claim 1, further comprising:
a serialization controller configured to control the first phase shifter, the first multiplexer, and the first latch unit in response to a read data output signal used to enable data output in response to the read command and a data clock used as a criterion for the data output.

5. The semiconductor memory device as recited in claim 4, wherein the serialization controller comprises:
a first latch configured to generate a first control pulse for controlling the phase shifter in response to the read data output signal;
a second latch configured to generate a second control pulse having an activation period of two times longer the cycle of the data clock to control the multiplexer; and
a third latch configured to output a data transfer signal having an activation period of four times longer than a cycle of a data clock to control the latch unit.

6. The semiconductor memory device as recited in claim 1, wherein a data window of each data in the fifth and sixth serial data output from the second serializer is two times a data window of each data in the seventh serial data.

7. The semiconductor memory device as recited in claim wherein the second serializer comprises:
a second phase shifter configured to shift the phase of a portion of the first to fourth serial data two times a data window of each data in the seventh serial data;
a second multiplexer configured to multiplex the other portion of the first to fourth serial data and the output of the phase shifter to output the fifth and sixth serial data; and
a second latch unit configured to latch the output of the multiplexer.

8. The semiconductor memory device as recited in claim 1, wherein the third serializer comprises:
a third phase shifter configured to shift the phase of a portion of the fifth and sixth serial data by a data window of each data in the seventh serial data; and
a third multiplexer configured to multiplex the other portion of the fifth and sixth serial data and the output of the phase shifter to output the seventh serial data.

9. The semiconductor memory device as recited in claim 8, wherein the third phase shifter in the third serializer outputs random data, which are not synchronized with a system clock, in a test operation or in a training operation; and
the third multiplexer transfers the random data to the outside of the semiconductor memory device.

10. The semiconductor memory device as recited in claim 9, wherein the third phase shifter comprises:
a data inverter configured to invert data in synchronization with a data clock;
an asynchronous data generator configured to output the random data in the test operation or in the training operation; and
an inverter latch configured to latch the output of the data inverter and the output of the asynchronous data generator to output an inversion signal.

11. A semiconductor device comprising:
a first serializer configured to partially serialize input 8-bit parallel data, which are received from the internal unit cells in response to a read command, to output first to fourth serial data;
a second serializer configured to partially serialize the first to fourth serial data to output fifth and sixth serial data; and
a third serializer configured to serialize the fifth and sixth serial data to output seventh serial data wherein the first serializer adds preamble data to each of the output first to fourth serial data according to an operation mode.

12. The semiconductor memory device as recited in claim 11, wherein the first serializer comprises:
a phase shifter configured to shift the phase of 4-bit data among the 8-bit parallel data four times a data window of each data in the seventh serial data after outputting the preamble data according to the operation mode;
a multiplexer configured to multiplex the other 4-bit data among the 8-bit parallel data and the output of the phase shifter to output the first to fourth serial data; and
a latch unit configured to latch the output of the multiplexer.

13. The semiconductor memory device as recited in claim 12, wherein the phase shifter comprises:
a plurality of unit phase shifters configured to shift the phases of the respective 4-bit data, each of the unit phase shifters comprising:
a first inverter configured to invert input data;
a transfer gate configured to transfer the output of the first inverter in response to a first control pulse; and
an inverter latch configured to latch and invert the output of the transfer gate after outputting the preamble data according to the operation mode.

14. The semiconductor memory device as recited in claim 13, wherein the inverter latch comprises:
a transistor configured to transfer preamble data of a logic high level in response to a first pattern enable signal;
a NAND gate configured to invert the output of the transfer gate and the output of the transistor when a second pattern enable signal is deactivated, and to output preamble data of a logic high level when the second pattern enable signal is activated; and
a second inverter configured to invert the output of the NAND gate to feed back the resulting data.

15. The semiconductor memory device as recited in claim 13, further comprising:
a serialization controller configured to control the phase shifter, the multiplexer, and the latch unit in response to a read data output signal used to enable data output in response to the read command and a data clock used as a criterion for the data output.

16. The semiconductor memory device as recited in claim 15, wherein the serialization controller comprises:
    a first latch configured to generate the first control pulse for controlling the phase shifter in response to the read data output signal;
    a second latch configured to generate a second control pulse having an activation period of two times longer the cycle of the data clock to control the multiplexer;
    a third latch configured to output a data transfer signal having an activation period four or eight times the cycle of the data clock for controlling the latch unit in response to a preamble signal for determining the operation mode;
    a fourth latch configured to output a first pattern enable signal in response to a preamble signal and a first pattern signal before activation of the first control pulse; and
    a fifth latch configured to output a second pattern enable signal in response to the preamble signal and a second pattern signal before activation of the first control pulse.

17. A semiconductor memory device comprising:
    a first serializer configured to partially serialize input 8-bit parallel data, which are received from internal unit cells in response to a read command, to output first to fourth serial data, the window of each data in the first to fourth serial data being four times the window of each data in a seventh serial data;
    a second serializer configured to partially serialize the first to fourth serial data to output and sixth serial data, a data window of each data in the fifth and sixth serial data being two times a data window of each data in the seventh serial data; and
    a third serializer configured to serialize the fifth and sixth serial data to output seventh serial data,
    wherein the third serializer outputs random data, which are not synchronized with a system clock, external to the semiconductor memory device in a test operation or in a training operation.

18. The semiconductor memory device as recited in claim 17, wherein each of the first to third serializers comprises:
    a phase shifter configured to shift the phase of the half of input data by the data window of output data; and
    a multiplexer configured to multiplex the other half of the input data and the output of the phase shifter to generate the output data.

19. The semiconductor memory device as recited in claim 18, wherein each of the first and second serializers further comprises:
    a latch unit configured to latch the output of the multiplexer.

20. The semiconductor memory device as recited in claim 18, further comprising:
    a serialization controller configured to control the first serializer in response to a data enable signal enabling data transfer and a data clock serving as a criterion for the data output.

21. The semiconductor memory device as recited in claim 20, wherein the serialization controller comprises:
    a first latch configured to generate a first pulse for controlling the phase shifter of the first serializer in response to the data read enable signal, the first pulse having an activation period by the cycle of the dataclock;
    a second latch configured to generate a second pulse for controlling the multiplexer of the first serializer, the second pulse having an activation period two times the cycle of the data clock; and
    a third latch configured to generate a third pulse for controlling the latch unit of the first serializer, the third pulse having an activation period four times the cycle of the data clock.

22. A semiconductor memory device comprising:
    a first serializer configured to partially serialize 8-bit parallel data, which are received from internal unit cells in response to a read command, to output first to fourth serial data, the window of each data in the first to fourth serial data being four times the window of each data in the seventh serial data;
    a second serializer configured to partially serialize the first to fourth serial data to output fifth and sixth serial data, a data window of each data in the fifth and sixth serial data being two times a data window of each data in the seventh serial data; and
    a third serializer configured to serialize the fifth and sixth serial data to output seventh serial data, wherein the first serializer adds preamble data to each of the output first to fourth serial data according to an operation mode.

23. The semiconductor memory device as recited in claim 22, wherein the first serializer comprises:
    a phase shifter configured to shift the phase of 4-bit data among the 8-bit parallel data four times the data window of each data in the seventh serial data after outputting the preamble data according to the operation mode; and
    a multiplexer configured to multiplex the other 4-bit data among the 8-bit parallel data and the output of the phase shifter to output the first to fourth serial data.

24. The semiconductor memory device as recited in claim 23, wherein the first serializers further comprises:
    a latch unit configured to latch the output of the multiplexer.

25. The semiconductor memory device as recited in claim 22, wherein each of the second and third serializers comprises:
    a phase shifter configured to shift the phase of half of input data by the data window of output data; and
    a multiplexer configured to multiplex the other half of the input data and the output of the phase shifter to generate the output data.

26. A method for operating a semiconductor memory device, comprises:
    a first serialization operation of partially serializing input 8-bit parallel data, which are received from internal unit cells in response to a read command, to output first to fourth serial data;
    a second serialization operation of partially serializing the firs to fourth serial data to output fifth and sixth serial data; and
    a third serialization operation of serializing the fifth and sixth serial data to output seventh serial data,
    wherein the third serialization operation comprises:
    outputting random data, which are not synchronized with a system clock, external to the semiconductor memory device in a test operation or in a training operation.

27. The method as recited in claim 26, wherein a data window of each data in the first to fourth serial data output in the first serialization operation is four times a data window of each data in the seventh serial data output in the third serialization operation.

28. The method as recited in claim 26, wherein the first serialization operation comprises:
    shifting the phase of 4-bit data of the 8-bit parallel data four times a data window of each data in the seventh serial data;

multiplexing the other 4-bit data of the 8-bit parallel data and the phase-shifted 4-bit data to output the first to fourth serial data;

and latching the first to fourth serial data.

29. The method as recited in claim 26, wherein a data window of each data in the fifth and sixth serial data output in the second serialization operation is two times a data window of each data in the seventh serial data output in the third serialization operation.

30. The method as recited in claim 29, wherein the second serialization operation comprises:

shifting the phase of a portion of the first to fourth serial data two times the data window each data in the seventh serial data;

multiplexing the other portion of the first to fourth serial data and the phase-shifted first and third serial data to output the fifth and sixth serial data; and latching the fifth and sixth serial data.

31. The method as recited in claim 26, wherein the third serialization operation comprises:

shifting the phase of a portion of the fifth and sixth serial data by a data window of each data in the seventh serial data; and multiplexing the other portion of the fifth and sixth serial data and the phase-shifted fifth serial data to output the seventh serial data.

32. A method for operating a semiconductor memory device, comprises:

a first serialization operation of partially serializing input 8-bit parallel data, which are received from internal unit cells in response to a read command, to output first to fourth serial data;

a second serialization operation of partially serializing the first to fourth serial data to output fifth and sixth serial data; and a third serialization operation of serializing the fifth and sixth serial data to output seventh serial data wherein the first serialization operation adds preamble data to each output first to fourth serial data according to an operation mode.

33. The method as recited in claim 32, wherein the first serialization operation comprises:

outputting the preamble data according to the operation mode and shifting the phase of 4-bit data of the 8-bit parallel data four times a data window of each data in the seventh serial data;

multiplexing the other portion of the 8-bit parallel data and the phase-shifted 4-bit data to output the fifth and sixth serial data; and latching the fifth and sixth serial data.

* * * * *